(12) United States Patent
Puzella et al.

(10) Patent No.: US 11,876,278 B2
(45) Date of Patent: Jan. 16, 2024

(54) BALUN COMPRISING STEPPED TRANSITIONS BETWEEN BALANCE AND UNBALANCE CONNECTIONS, WHERE THE STEPPED TRANSITIONS INCLUDE GROUND RINGS OF DIFFERING LENGTHS CONNECTED BY CAGED VIAS

(71) Applicant: Raytheon Company, Waltham, MA (US)

(72) Inventors: Angelo M. Puzella, Waltham, MA (US); John B. Francis, Waltham, MA (US)

(73) Assignee: RAYTHEON COMPANY, Waltham, MA (US)

( * ) Notice: Subject to any disclaimer, the term of this patent is extended or adjusted under 35 U.S.C. 154(b) by 431 days.

(21) Appl. No.: 17/215,864

(22) Filed: Mar. 29, 2021

(65) Prior Publication Data
US 2022/0311117 A1    Sep. 29, 2022

(51) Int. Cl.
*H01P 5/10* (2006.01)
*H01Q 1/24* (2006.01)
(Continued)

(52) U.S. Cl.
CPC ............... *H01P 5/10* (2013.01); *H01Q 1/246* (2013.01); *H01Q 1/38* (2013.01); *H05K 1/0215* (2013.01);
(Continued)

(58) Field of Classification Search
CPC ........................................................ H01P 5/10
(Continued)

(56) References Cited

U.S. PATENT DOCUMENTS

| | | |
|---|---|---|
| 4,495,505 A | 1/1985 | Shields |
| 4,755,775 A | 7/1988 | Marczewski et al. |

(Continued)

FOREIGN PATENT DOCUMENTS

GB    2408153 A    5/2005

OTHER PUBLICATIONS

Bao Wang et al., "Probe-fed dipole antenna with parasitic patches for wideband and wide-scanning planar phased arrays," IET Microwaves, Antennas & Propagation, The Institution of Engineering and Technology, United Kingdom, vol. 15, No. 5, Mar. 11, 2021, pp. 529-535. (Retrieved on Aug. 10, 2022 from URL: https://ietresearch.onlinelibrary.wiley.com/doi/epdf/10.1049/mia2.12065).

(Continued)

*Primary Examiner* — Benny T Lee
(74) *Attorney, Agent, or Firm* — Burns & Levinson, LLP; Joseph M. Maraia

(57) ABSTRACT

An example balun includes a center conductor that passes through a printed wiring board having multiple dielectric layers and cage vias arranged relative to the center conductor. The cage vias include a first set of cage vias that extend between an unbalanced connection to the balun and a balanced connection to the balun. The first set of cage vias are part of a first circular arc and are connected to electrical ground through a first ground ring. The cage vias include a second set of cage vias that extend from the unbalanced connection part-way through the printed wiring board. The second set of cage vias are part of a second circular arc and are connected to the electrical ground through a second ground ring. The second circular arc is longer than the first circular arc.

21 Claims, 24 Drawing Sheets

(51) Int. Cl.
*H01Q 1/38* (2006.01)
*H05K 1/02* (2006.01)
*H05K 1/11* (2006.01)

(52) U.S. Cl.
CPC ... *H05K 1/116* (2013.01); *H05K 2201/10098* (2013.01)

(58) Field of Classification Search
USPC .......................................................... 333/26
See application file for complete search history.

(56) References Cited

U.S. PATENT DOCUMENTS

| | | | |
|---|---|---|---|
| 4,825,220 A | 4/1989 | Edward et al. |
| 5,973,653 A | 10/1999 | Kragalott et al. |
| 6,133,806 A | 10/2000 | Sheen |
| 6,351,192 B1 | 2/2002 | Sheen |
| 6,476,704 B2 | 11/2002 | Goff |
| 6,529,090 B2 | 3/2003 | Lam |
| 6,611,180 B1 | 8/2003 | Puzella et al. |
| 6,624,787 B2 | 9/2003 | Puzella et al. |
| 6,731,189 B2 | 5/2004 | Puzella et al. |
| 7,226,328 B1 | 8/2007 | Puzella et al. |
| 7,348,932 B1 | 3/2008 | Puzella et al. |
| 7,671,696 B1 | 3/2010 | Puzella et al. |
| 7,821,372 B2 | 10/2010 | Ho-Hsiang |
| 7,859,835 B2 | 12/2010 | Puzella et al. |
| 8,279,131 B2 | 10/2012 | Puzella et al. |
| 8,283,991 B1 | 10/2012 | Essenwanger |
| 8,451,165 B2 | 5/2013 | Puzella et al. |
| 8,471,646 B2 | 6/2013 | Essenwanger |
| 8,581,801 B2 | 11/2013 | Puzella et al. |
| 8,624,688 B2 | 1/2014 | Essenwanger |
| 8,917,150 B2 | 12/2014 | Vanhille et al. |
| 8,981,869 B2 | 3/2015 | Puzella et al. |
| 9,019,166 B2 | 4/2015 | Puzella et al. |
| 9,124,361 B2 | 9/2015 | Puzella et al. |
| 9,160,295 B2 | 10/2015 | Waks et al. |
| 9,172,145 B2 | 10/2015 | Puzella et al. |
| 9,306,262 B2 | 4/2016 | Puzella et al. |
| 9,397,766 B2 | 7/2016 | Puzella et al. |
| 9,564,868 B2 | 2/2017 | Nguyen et al. |
| 9,974,159 B2 | 5/2018 | Puzella et al. |
| 10,276,282 B2 | 4/2019 | Puzella et al. |
| 10,454,161 B1 | 10/2019 | Puzella et al. |
| 10,862,204 B2 | 12/2020 | Puzella et al. |
| 2003/0067410 A1 | 4/2003 | Puzella et al. |
| 2004/0000979 A1 | 1/2004 | Puzella et al. |
| 2007/0123122 A1 | 5/2007 | Puzella et al. |
| 2008/0074324 A1 | 3/2008 | Alm et al. |
| 2009/0256748 A1 | 10/2009 | Alm et al. |
| 2010/0033262 A1 | 2/2010 | Puzella et al. |
| 2010/0066631 A1 | 3/2010 | Puzella et al. |
| 2010/0126010 A1 | 5/2010 | Puzella et al. |
| 2010/0245179 A1 | 9/2010 | Puzella et al. |
| 2011/0291907 A1 | 12/2011 | Puzella et al. |
| 2012/0068782 A1* | 3/2012 | Rofougaran ........... H03H 7/422 333/25 |
| 2012/0139786 A1 | 6/2012 | Puzella et al. |
| 2012/0313818 A1 | 12/2012 | Puzella et al. |
| 2013/0088381 A1 | 4/2013 | Puzella et al. |
| 2014/0111373 A1 | 4/2014 | Puzella et al. |
| 2014/0218253 A1 | 8/2014 | Puzella et al. |
| 2015/0015453 A1 | 1/2015 | Puzella et al. |
| 2017/0142824 A1 | 5/2017 | Puzella et al. |
| 2019/0035517 A1 | 1/2019 | Puzella et al. |
| 2019/0221918 A1 | 7/2019 | Vollmer et al. |
| 2020/0044328 A1 | 2/2020 | Puzella et al. |

OTHER PUBLICATIONS

International Search Report for International Patent Application No. PCT/US2022/022156, dated Jul. 12, 2022, (5 pages).
Written Opinion for International Patent Application No. PCT/US2022/022156, dated Jul. 12, 2022, (8 pages).
Abdolahi, Mohsen et al.. (May 2017). "Broadband eight-way coaxial waveguide high power combiner/divider". 2017 Progress in Electromagnetics Research Symposium—Spring (PIERS), St Petersburg, Russia, (7 pages).
Resley, L., et al. "Ka-Band Klopfenstein Tapered Impedance Transformer for Radar Applications" Department of Electrical and Computer Engineering, University of Colorado, Progress in Electromagnetics Research C, vol. 27, 2012, pp. 253-263, (11 pages).
International Preliminary Report on Patentability in Application No. PCT/US2022/022156 dated Oct. 12, 2023, 10 pages.

* cited by examiner

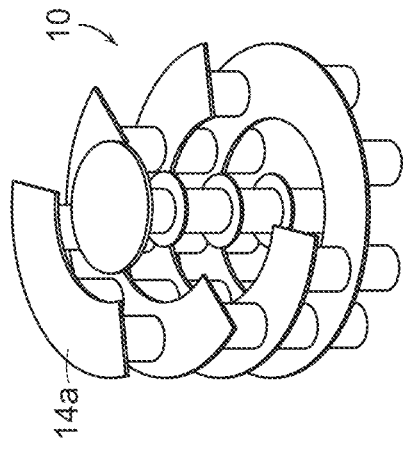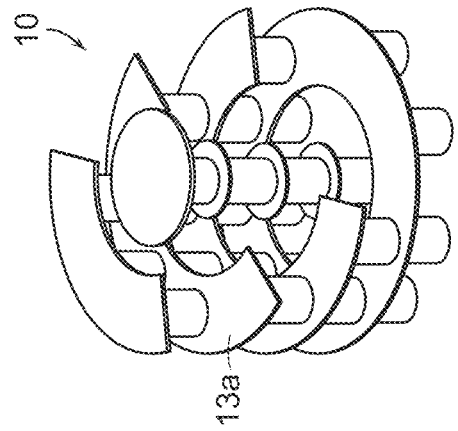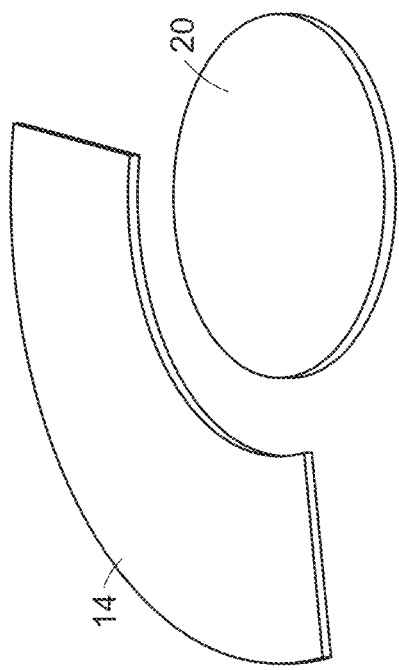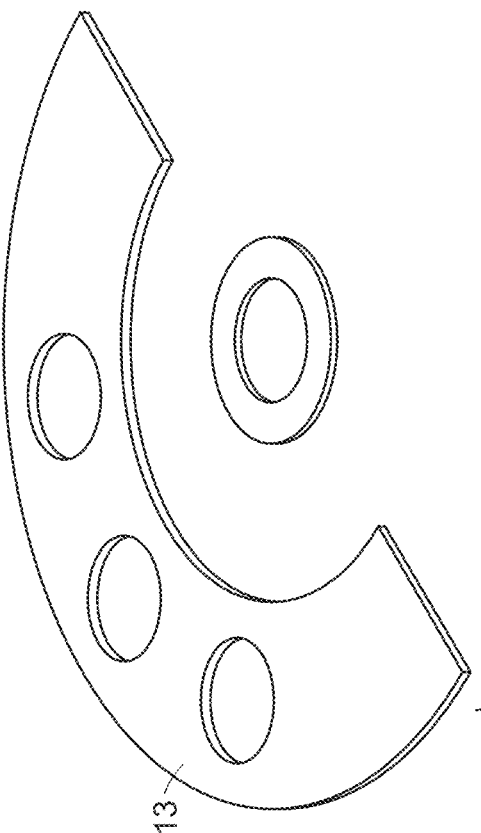
FIG. 2
FIG. 3

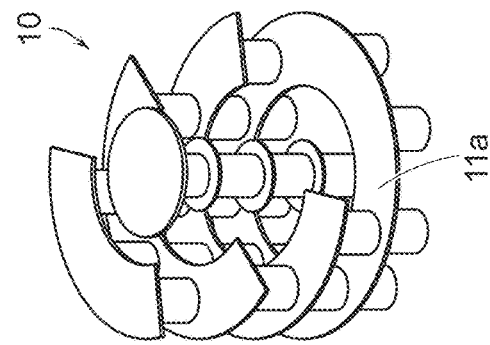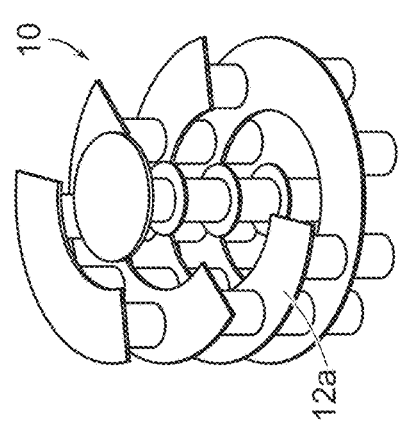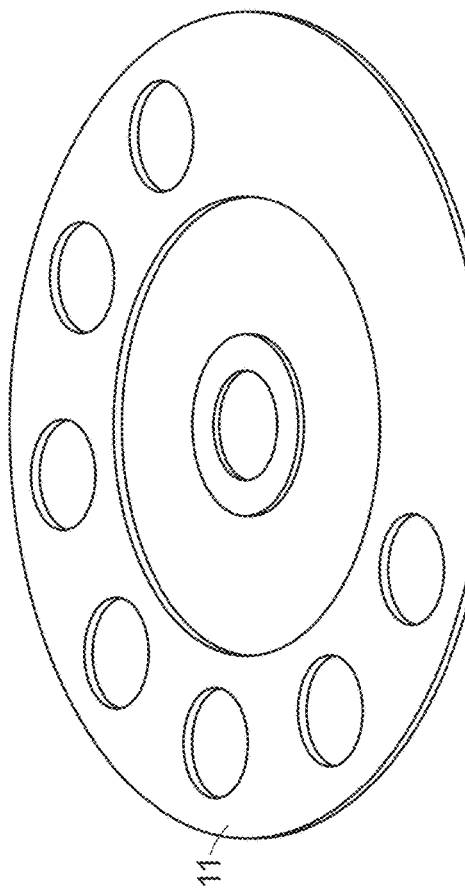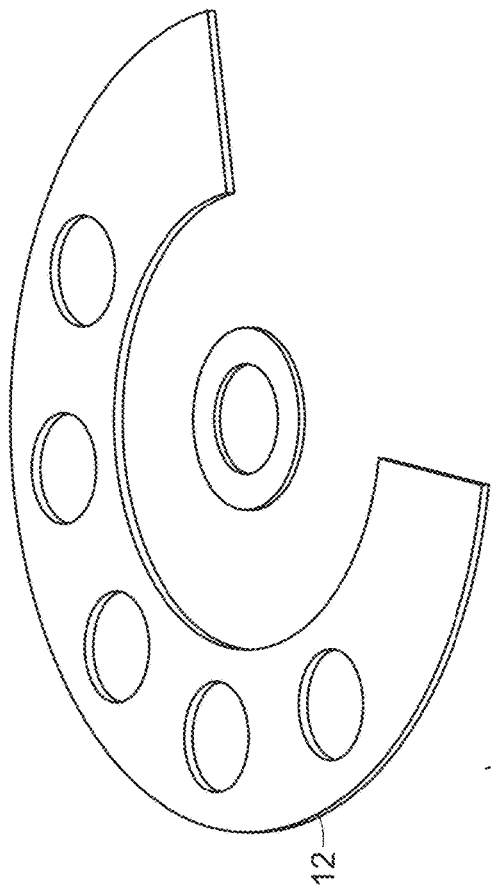
FIG. 4
FIG. 5

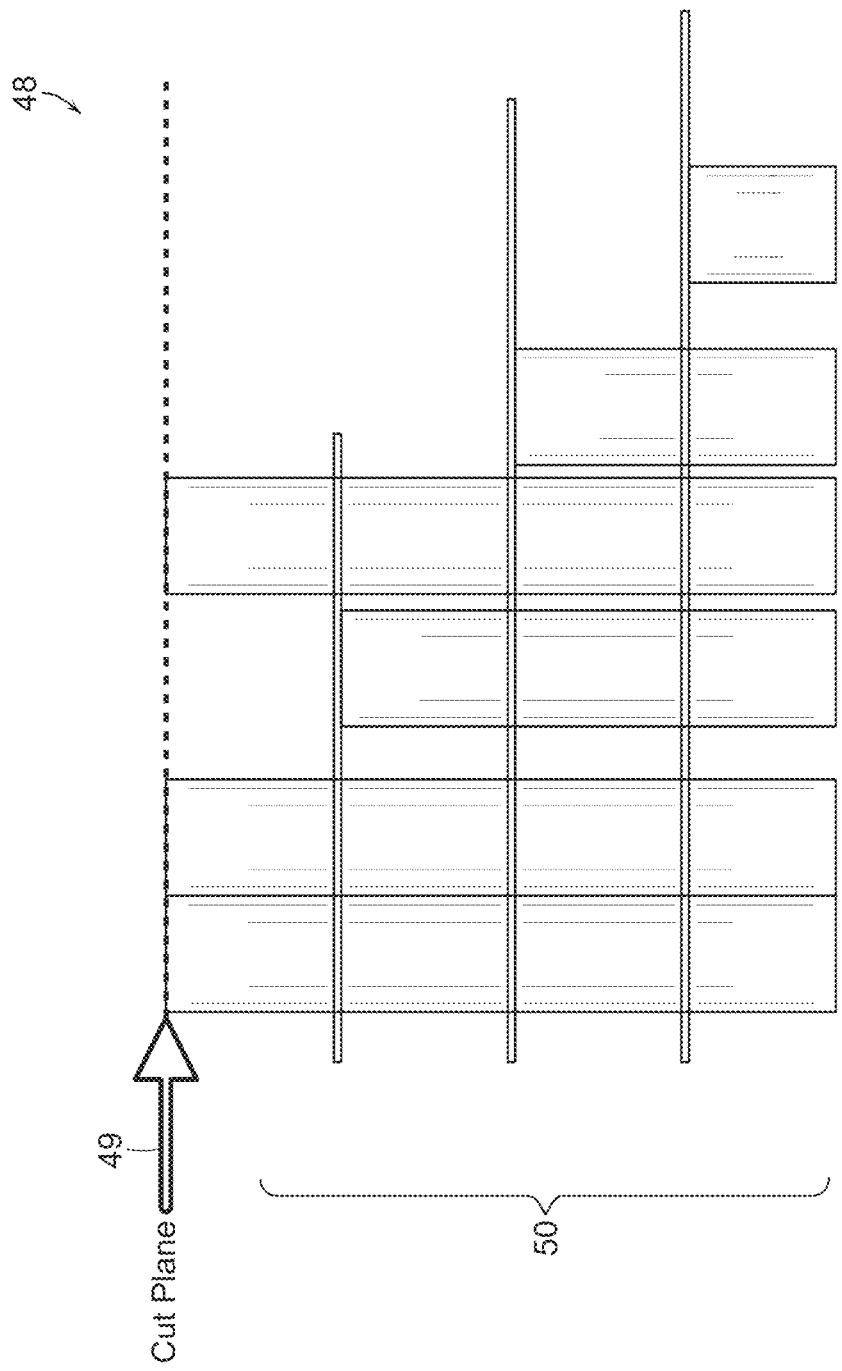

BALUN COMPRISING STEPPED TRANSITIONS BETWEEN BALANCE AND UNBALANCE CONNECTIONS, WHERE THE STEPPED TRANSITIONS INCLUDE GROUND RINGS OF DIFFERING LENGTHS CONNECTED BY CAGED VIAS

TECHNICAL FIELD

This specification describes examples of a stepped balun and example uses thereof.

BACKGROUND

Baluns include electrical devices configured to convert between a balanced signal connection and an unbalanced signal connection.

SUMMARY

An example balun includes a center conductor that passes through a printed wiring board having multiple dielectric layers and cage vias arranged relative to the center conductor. The cage vias include a first set of cage vias that extend between an unbalanced connection to the balun and a balanced connection to the balun. The first set of cage vias are part of a first circular arc and are connected to electrical ground through a first ground ring. The cage vias include a second set of cage vias that extend from the unbalanced connection part-way through the printed wiring board. The second set of cage vias are part of a second circular arc and are connected to the electrical ground through a second ground ring. The second circular arc is longer than the first circular arc.

The distance from the balanced connection to the unbalanced connection may be a first distance. The second set of cage vias may extend a second distance through the printed wiring board. The first distance and the second distance may be different. The balun may also include a third set of cage vias that extend from the unbalanced connection a third distance through the printed wiring board. The third distance may be greater than the second distance and less than the first distance. The third set of cage vias may be part of a third circular arc and may be connected to the electrical ground through a third ground ring. The third circular arc may be longer than the first circular arc and shorter than the second circular arc. The balun may also include a fourth set of cage vias that extend from the unbalanced connection a fourth distance through the printed wiring board. The fourth distance may be between the second distance and the third distance. The fourth set of cage vias may be part of a fourth circular arc and may be connected to the electrical ground through a fourth ground ring. The fourth circular arc may be longer than the third circular arc and shorter than the second circular arc. There may be three vias in the first set of cage vias, five vias in the third set of cage vias, seven vias in the fourth set of cage vias, and nine vias in the second set of cage vias. The second circular arc may be 360° around the center conductor.

The cage vias may be primary cage vias. The balun may also include secondary cage vias connected to the electrical ground. The secondary cage vias may be arranged in a circular arc around the primary cage vias. The secondary cage vias may be arranged in a 360° circular arc around the primary cage vias. The secondary cage vias may extend from a layer of the printed wiring board at which the unbalanced connection is located to a layer of the printed wiring board at which the balanced connection is located.

The balun may include one or more tuning rings connected along a length of the center conductor. The one or more tuning rings may be configured to add capacitance to control how impedance of the balun changes with frequency of a signal passing through the balun. The following parameters may be selected to achieve target performance for the balun: diameters of individual cage vias and the center conductor, a number of layers of the printed wiring board with each layer corresponding to a termination point of a set of cage vias, a dielectric constant associated with dielectric material of the multiple dielectric layers, and tuning rings associated with the center conductor to change a capacitance associated with the balun.

The unbalanced connection may be configured for connection to a coaxial cable. The balanced connection may be configured for connection to an antenna. The antenna may be an antenna in a phased array having multiple antennas, in which each antenna includes an analog transmitter/receiver module configured to create phase shifting required to electronically steer an antenna beam. The balanced connection may be configured for connection to a 5G cellular telephone tower antenna. The balanced connection may be configured for connection to a circuit board containing a digital signal processor (DSP).

An example balun includes a center conductor that passes through a printed circuit wiring board having multiple dielectric layers. The balun also includes stepped transitions between a balanced connection of the balun and an unbalanced connection of the balun. The stepped transitions include ground rings arranged in circular arcs and connected to electrical ground. The ground rings increase in length from a first ground ring at the balanced connection to a second ground ring at the unbalanced connection. The stepped transitions include cage vias connected between the second ground ring and each other ground ring.

The balun may include one or more tuning rings connected along a length of the center conductor. The one or more tuning rings may be configured to add capacitance to control how impedance of the balun changes with frequency of a signal passing through the balun. The unbalanced connection may he configured for connection to a coaxial cable. The balanced connection may he configured for connection to an antenna in a phased array that includes multiple antennas, in which each antenna includes an analog transmitter/receiver module configured to create phase shifting required to electronically steer an antenna beam. The balanced connection may be configured for connection to a 5G cellular telephone tower antenna. The balanced connection may be configured for connection to a circuit board containing a digital signal processor (DSP). The cage vias may be primary cage vias. The balun may also include secondary cage vias connected to the electrical ground. The secondary cage vias may be arranged in a 360° circular arc around the primary cage vias.

An example system includes a first balun and a second balun. Each of the first balun and the second balun includes a center conductor that passes through a printed circuit wiring board having multiple dielectric layers. The balun also includes stepped transitions between a balanced connection of the balun and an unbalanced connection of the balun. The stepped transitions include ground rings as ranged in circular arcs and connected to electrical ground. The ground rings increase in length from a. first ground ring at the balanced connection to a second ground ring at the unbalanced connection. The stepped transitions include cage vias connected between the second ground ring and each other ground ring. A transmission line is between the first balun and the second balun. The first balun is connected to the transmission line through the balanced connection thereof and the second balun is connected to the transmission line through the balanced connection thereof.

The apparatus, systems, and/or components thereof described herein may be configured, for example, through design, construction, arrangement, placement, operation, and/or signaling.

Two or more of the features described in this specification, including in this summary section, may be combined to form implementations not specifically described in this specification.

The details of one or more implementations are set forth in the accompanying drawings and the description below. Other features and advantages will be apparent from the description and drawings, and from the claims.

DESCRIPTION OF THE DRAWINGS

FIGS. 2, 3, 4, and 5 are perspective views of ground rings included in the example stepped balun, along with the stepped balun itself.

FIG. 11 is a side view of an example stepped balun.

Like reference numerals in the detailed description of different figures indicate like elements.

DETAILED DESCRIPTION OF THE INVENTION

Baluns include electrical devices configured to convert between a balanced signal connection and an unbalanced signal connection. An unbalanced signal connection includes an electromagnetic shield surrounding a center conductor. The shield is an outer conductor connected to electrical ground to reduce the amount of electrical interference reaching the center conductor. The current in the center conductor is referenced to the outer conductor. Accordingly, a signal voltage in the center conductor varies in relation to the electrical ground at the outer conductor. An example of conductors in an un-balanced signal configuration is a coaxial cable. A balanced signal connection includes two conductors for a signal, which have an equal impedance relative to electrical ground and which may both be surrounded by shielding in some examples. The currents through the two conductors are equal in magnitude, opposite in direction, and enclosed by magnetic field lines. The electric field between the conductors starts on one conductor and ends on the other conductor. Transmission of a signal over conductors in a balanced signal configuration may reduce the influence of noise or interference from external electric fields. Conductors in a balanced signal configuration may also be less susceptible to ground loops than conductors in an unbalanced configuration. An example of conductors in a balanced signal configuration is a dipole antenna connection.

Described herein is an example balun, called a "stepped balun". References to a stepped balun may include any of the variants described herein. In an example, the stepped balun includes a center conductor that passes through a printed wiring board having multiple dielectric layers. Stepped transitions between the balanced connection of the balun and the unbalanced connection of the balun enable conversion between the unbalanced connection and the balanced connection. In an example, the stepped transitions include ground rings configured in circular arcs that are connected to a common electrical ground. The ground rings decrease in length from a largest ground ring at the unbalanced connection to a smallest ground ring at the balanced connection, thereby gradually changing between an unbalanced connection and a balanced connection. The stepped transitions include cage vias connected among the various ground rings. The cage vias are electrically conductive structures, such as plated through-holes, in the sense that the vias form a "cage" that surround, at least partly, the center conductor.

Figure 1:
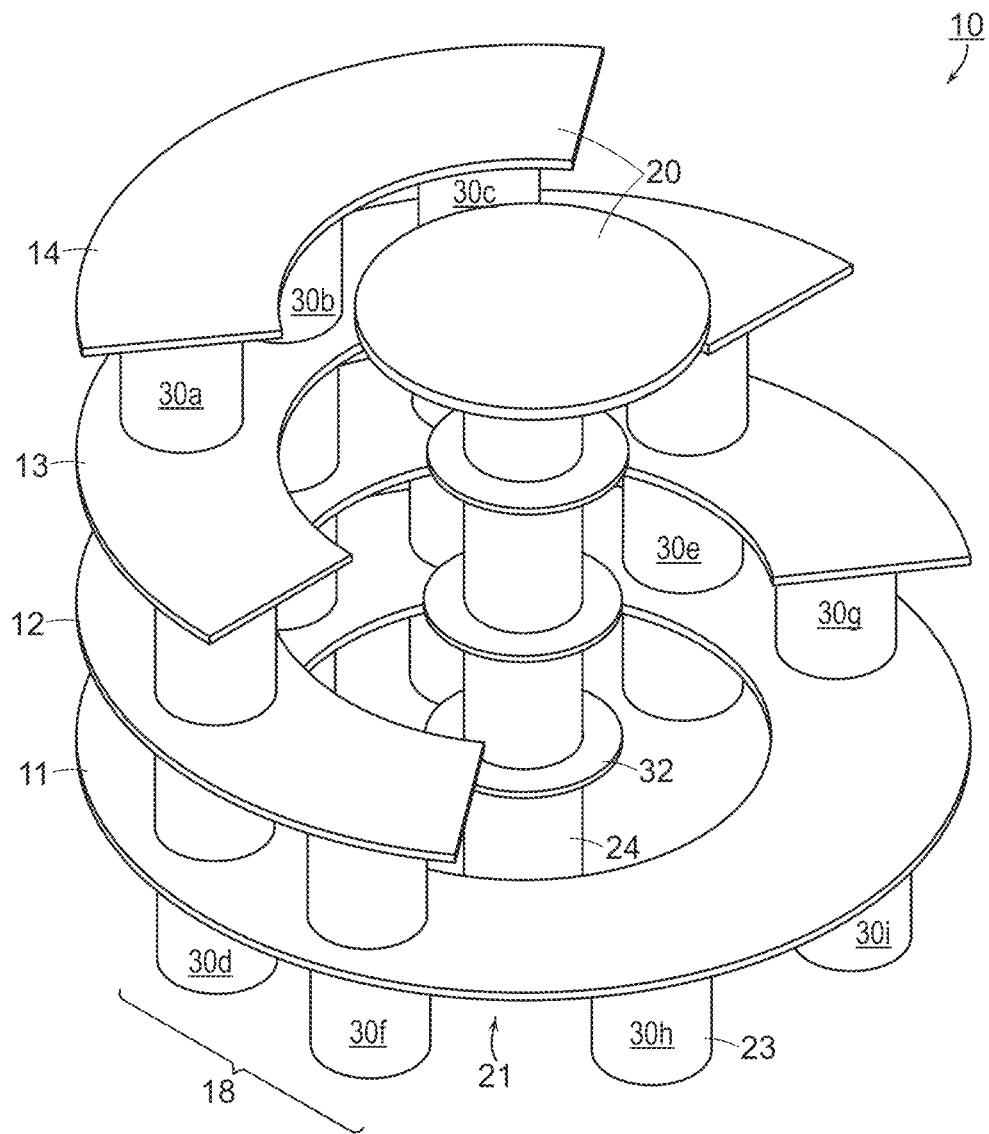
FIG. 1 is perspective view of an example stepped balun.

FIG. 1 shows an example of a stepped balun 10. In this example, there are four steps defined by four ground rings 11, 12, 13, and 14 in balun 10. As described in more detail below, ground rings 11, 12, 13, and 14 are connected electrically and physically, respectively, to nine cage vias (the cage vias are labeled 18 collectively), seven cage vias, five cage vias, and three cage vias. Stepped balun 10 is referred to as a four-step balun because there are four ground rings between the balanced connection 20 and the unbalanced connection 21. However, the stepped baluns described herein are not limited to the configuration shown in FIG. 1. For example, the numbers of steps and/or vias may be different in different implementations.

FIGS. 2 to 5 show example layouts of the ground rings and tunings rings (described below) at steps of balun 10. Arrows 14a, 13a, 12a, and 11a at balun 10 shown in the right of FIGS. 2, 3, 4, and 5 respectively show where the layer at the left is located. As shown in FIG. 3, ground ring 13 includes three holes to hold three cage vias that connect electrically to and physically to and through ground ring 13. As shown in FIG. 4, ground ring 12 includes five holes to hold five cage vias that connect electrically to and physically to and through ground ring 12. As shown in FIG. 5, ground ring 11 includes seven holes to hold seven cage vias that connect electrically to and physically to and through ground ring 11. As shown in FIG. 1, ground ring 11 also connects electrically and physically to cage vias, such as cage via 23, that terminate at ground ring 11—that is, that do not pass through ground ring 11.

Figure 6:
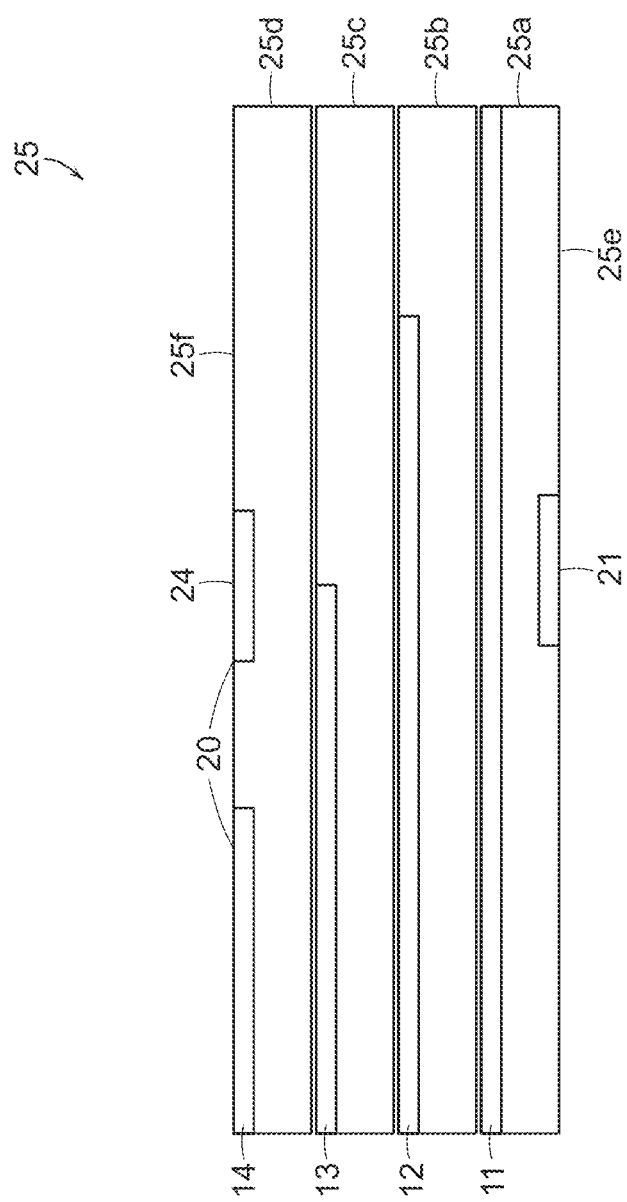
FIG. 6 is a cut-away side view of a printed wiring board in which the example stepped balun may be constructed.

Stepped balun 10 includes a center conductor 24 (FIG. 1) that passes orthogonally through a printed wiring board (PWD), such as printed wiring board 25 of FIG. 6, containing ground rings 11, 12, 13, and 14. The printed wiring board includes multiple dielectric layers 25a, 25b, 25c, and 25d and metal layers that form the ground rings. In this example, the printed wiring board includes at least four dielectric layers; however, other numbers of dielectric layers may be used. The center conductor is a plated through-hole via through the printed wiring board.

Figure 7:
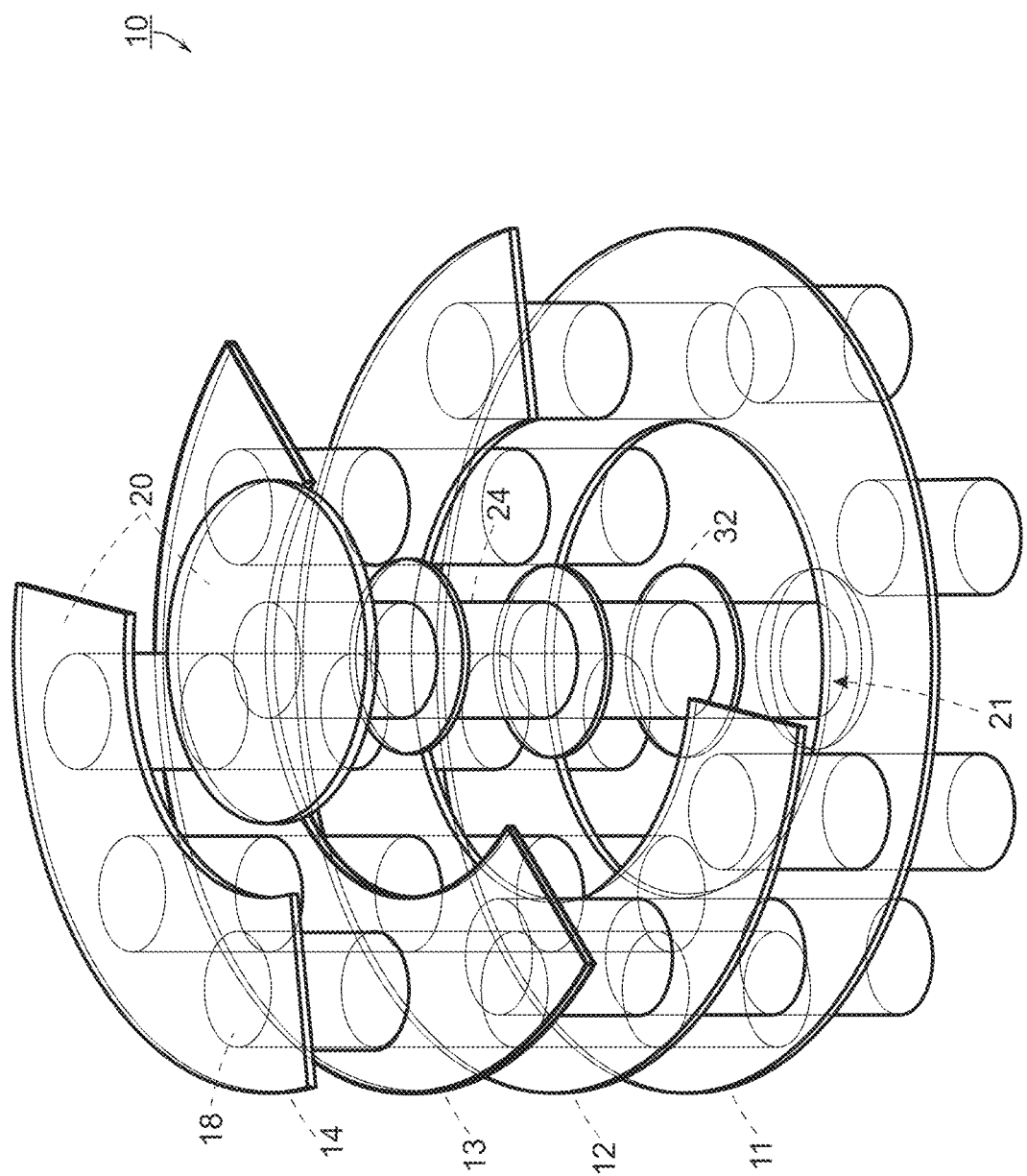
FIG. 7 is transparent perspective view of the example stepped balun.

Unbalanced electrical connection 21, an example of which is a coaxial connection, is included on one surface 25e of printed wiring board 25. Balanced electrical connection 24 is included on the other—for example, the opposite—surface 25f of printed wiring board 25. The balanced electrical connection includes both the center conductor and the ground ring 14. Both connections enable interfacing to standard components, such as a standard dipole antenna. FIG. 7 shows stepped balun 10 as transparent. Here, the balanced and unbalanced connections may be more readily apparent than in FIG. 1.

In an example, stepped balun 10 is configured to transform the fields and currents of an unbalanced transmission line into those for a balanced, two-conductor transmission line. The stepped balun thus is configured to convert balanced electrical signals to unbalanced electrical signals and convert unbalanced electrical signals to balanced electrical signals. In this context, the stepped balun can be viewed as a "field transformer". That is, stepped balun 10 transforms the coaxial line electric (and magnetic) field distribution into a two-conductor electric (and magnetic) field distribution over a relatively small electrical length. For example, as shown in FIGS. 1, 6, and 7, the ground rings (outer conductors) change in arc length gradually (step-wise) between unbalanced connection 21 and balanced connection 20 over the thickness of a printed wiring board, which is a relatively short distance. Stepped balun 10 performs the opposite transformation as well.

As shown in FIGS. 1 and 7, stepped balun 10 includes cage vias 18 arranged relative to the center conductor 24. In this example, the cage vias are arranged in circular arcs around center conductor 24, as shown. The circular arcs of the cage vias correspond to the shape of the ground rings, which are also in circular arcs. The sizes of the circular arcs progressively decrease from unbalanced balun connection 21 to balanced balun connection 20. For example, as shown in FIGS. 5 and 7, proximate to unbalanced connection 21, the circular arc (a circle herein) for ground ring 11 covers 360°. At the location of the first step towards the balanced connection, the circular arc for ground ring 12 (FIG. 7) covers about 270° in this example. At the location of the next step towards the balanced connection, the circular arc of ground ring 13 FIG. 7) covers about 180° in this example. At the location of the next step, that is, at the balanced connection 20, the circular arc covers about 90° in this example. The cage vias are arranged along these circular arcs as shown in FIG. 1.

As noted above, the extent and the lengths of the circular arcs—including the extent and lengths of the ground rings and spans of the cage vias—may be different than those shown and may vary based on a variety of factors, such as depth of the printed wiring board. The cage vias and ground rings at each step of the stepped balun are connected to the same electrical ground and are, therefore, configured to provide gradual or stepped transition between the balanced and unbalanced connections at opposite surfaces of the printed wiring board.

Figure 8:
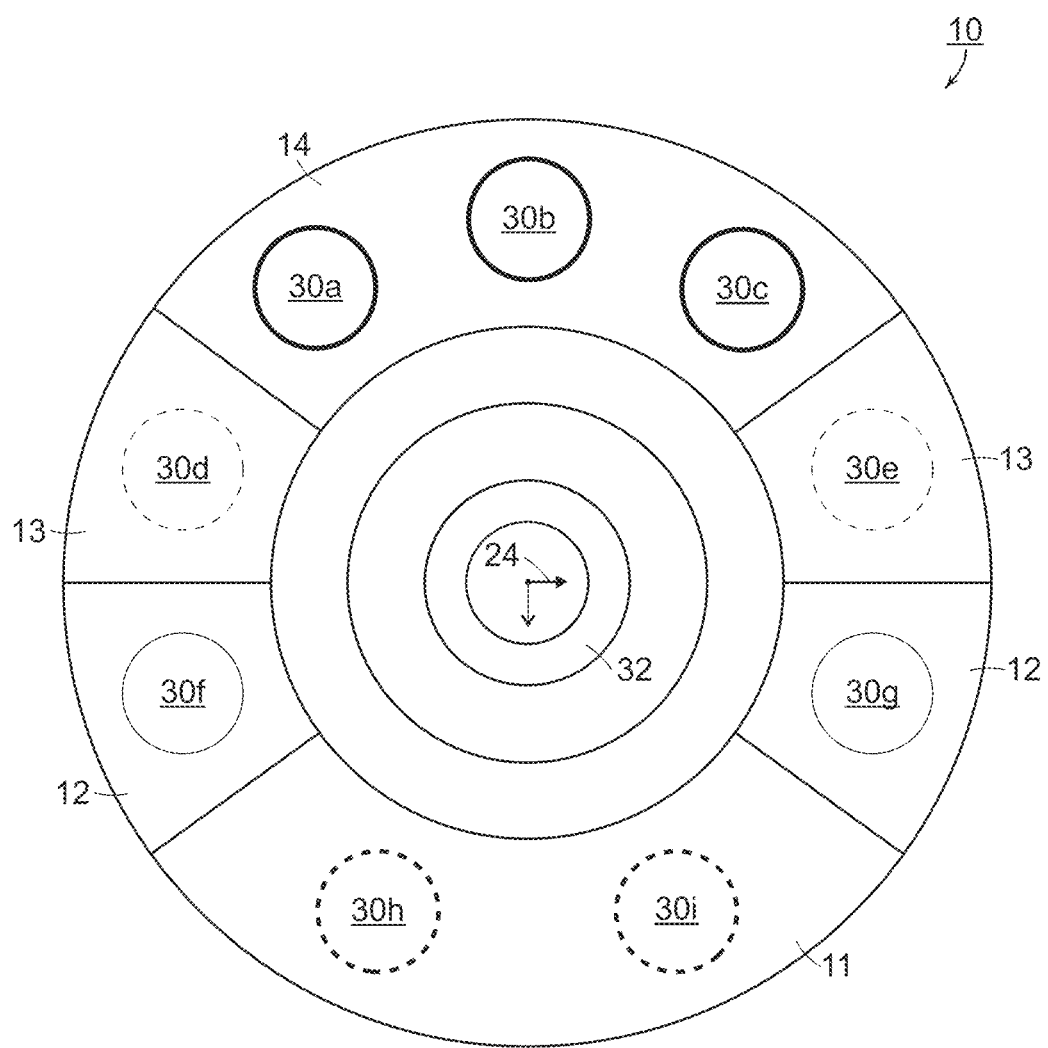
FIG. 8 is a top view of the example stepped balun.

Referring to FIG. 8, stepped balun 10 includes a first set 30a, 30b, 30c of three cage vias that extend all the way between unbalanced connection 21 and balanced connection 20. The first set of three cage vias is part of first circular arc of cage vias connected to ground ring 14. In this example, ground ring 14 may extend along a length that covers about 90°, or less, of a circle around center conductor 24. Unbalanced connection 21, in this example, includes a pseudo-coaxial connection that is configured for connection to a standard coaxial cable; however, a pseudo-coaxial connection configured for connection to customized coaxial cable may instead be used. Balanced connection 20 includes a two-conductor port to connect electrically to a balanced transmission line. An example two-conductor port includes a dipole antenna connection. Examples of antenna connections include, but are not limited to, two-terminal balanced feed antennas, such as, dipole antennas, bow-tie antennas, sinuous antennas, spiral antennas, folded dipole antennas, bi-conical antennas, yagi-uda antennas, and loop antennas.

Stepped balun 10 includes a second set of cage vias that are physically and electrically connected to unbalanced connection 21 and to ground ring 13. The cage vias in this set include cage vias 30a, 30b, and 30c, along with cage vias 30d and 30e. Accordingly, there are five cage vias in the second set. Stepped balun 10 includes a third set of cage vias that are physically and electrically connected to unbalanced connection 21 and to ground ring 12. The cage vias in this set include cage vias 30a, 30b, 30c, 30d, and 30e, along with cage vias 30f and 30g. Accordingly, there are seven cage vias in the third set. Stepped balun 10 includes a fourth set of cage vias that are physically and electrically connected to unbalanced connection 21 and to ground ring 11. The cage vias in this set include cage vias 30a, 30b, 30e, 30d, 30e, 30f, and 30g, along with cage vias 30h and 30i. Accordingly, there are nine cage vias in the third set. In this example, ground ring 11 extends in a complete circle (360°) around center conductor 24 to approximate a shield of a coaxial cable. Notably, the cage vias are discontinuous—that is, there dielectric between them—so they may not operate precisely like a coaxial cable. Cage vias 30a, 30b, 30c, 30d, 30e, 30f, 30g, 30h and 30i have also been labeled on FIG. 1.

As shown in FIGS. 1 and 7 and as previously noted, the ground rings, also referred to as "outer conductor rings," progressively decrease in arc length from unbalanced connection 21 to balanced connection 20 such that ground ring 11 is longer than ground ring 12, ground ring 12 is longer than ground ring 13, and ground ring 13 is longer than ground ring 14. Stated alternatively, the ground rings progressively increase in arc length from balanced connection 20 to unbalanced connection 21 such that ground ring 14 is shorter than ground ring 13, ground ring 13 is shorter than ground ring 12, and ground ring 12 is shorter than ground ring 11.

As noted, there are four ground rings in example stepped balun 10. As also noted previously, there are four dielectric layers included on printed wiring board, as shown in FIG. 6. Accordingly, in this example, each ground ring is formed on a surface of one of the dielectric layers. In some implementations, there may be more or fewer dielectric layers and, in those examples, more or fewer ground ring layers or steps in the stepped balun. For example, a stepped balun may include four, five, six, seven, eight, or more steps configured as described herein. In some implementations, the dielectric layers may be manufactured with ground rings inside the dielectric layers and, as such, the ground rings may not be located on the surfaces of individual dielectric layers in the printed wiring board.

Referring to FIGS. 1, 7, and 8, in some implementations, there may be one or more (e.g., three) tuning rings (or tuning pads) 32 connected along a length of center conductor 24 within the area enclosed by cage vias 18. That is, in some implementations, the tuning rings may be between the center conductor and the cage vias. The one or more tuning rings are configured to add capacitance to the stepped balun in order to control how impedance of the stepped balun changes operation with changes in frequency of a signal passing through the stepped balun. The tuning rings may include capacitors—for example, dielectric between conductive plates—or other appropriately configured conductive and/or non-conductive materials. Any appropriate number of tuning rings may be used. Their numbers and positions may be dictated by a target performance.

Figure 10:
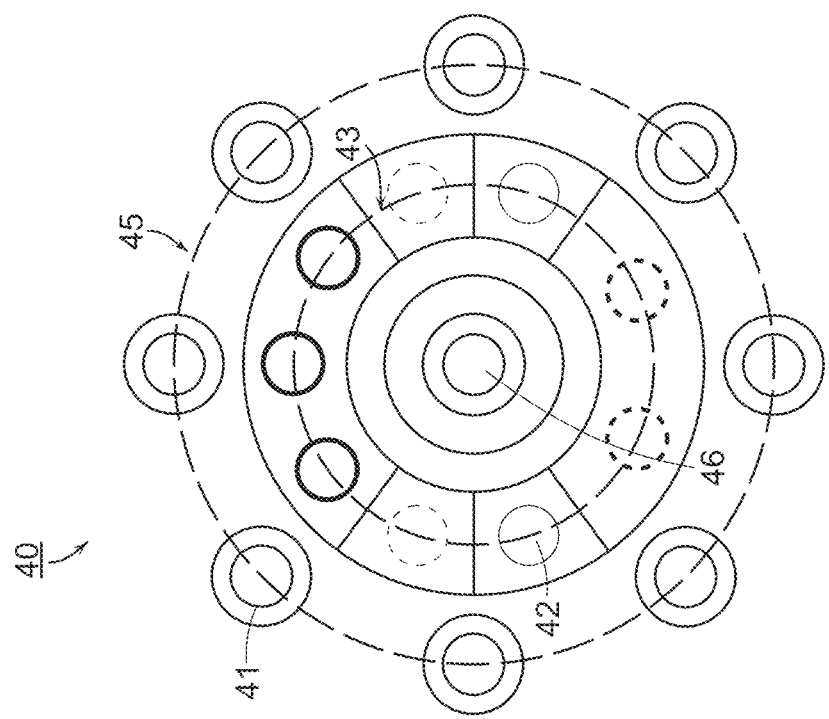
FIG. 10 is a top view of the example stepped balun of FIG. 9.
Figure 9:
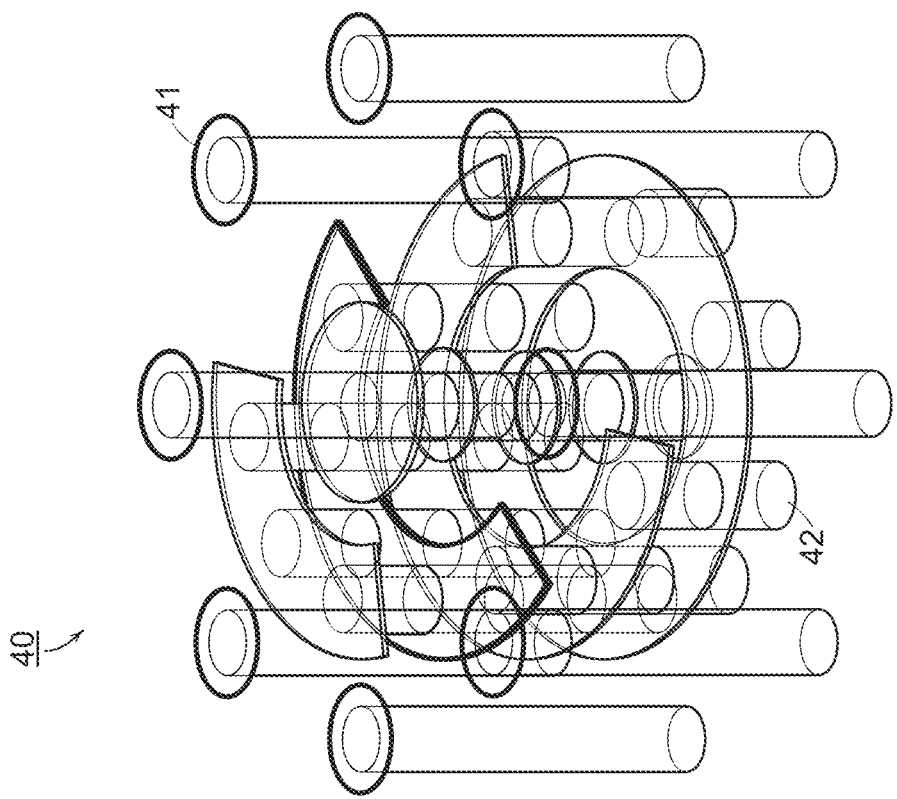
FIG. 9 is a transparent perspective view of another example stepped balun.

The cage vias of FIGS. 1 to 8—the first, second, third, and fourth sets—are referred to as "primary cage vias." As shown in FIGS. 9 and 10, a stepped balun 40, Which otherwise has the same structure as stepped balun 10 of FIGS. 1 to 8, may include a set of secondary cage was 41. Primary cage vias 42 may be at a first radius 43 relative to center conductor 46, and secondary cage vias 41 may be at a larger radius 45 relative to center conductor 46, as shown in FIG. 10. The secondary cage vias 41 may surround the primary cage vias 42 in whole as shown in FIGS. 9 and 10, or in part, and may extend from a layer of the printed wiring hoard at which the unbalanced connection is located (or proximate thereto) to a layer of the printed wiring board at which the balanced connection is located. The secondary cage vias include electrically conductive structures, such as plated through-holes, in the sense that the vias form a "cage" that surround, at least partly, the primary cage vias and, consequently, also the center conductor. The secondary cage vias connect to the same electrical ground as the ground rings and the primary cage vias. Connection may be at the layer of the printed wiring board containing the balanced connection, at the layer of the printed wiring board containing the unbalanced connection, or at both layers. In some implementations, the secondary vias are arranged in a 360° circular arc around the primary cage vias. In this configuration, the secondary cage vias electromagnetically shield the stepped balun. In stepped balun 40, there are eight secondary cage vias, however, any appropriate number may be used.

To vary the performance of the stepped balun—for example, to achieve a target performance—the following parameters may be configured or changed: diameters of individual primary and/or secondary cage vias, a diameter of the center conductor, a number of layers of the printed wiring board, a dielectric constant associated with dielectric material of the multiple dielectric layers, and tuning rings associated with the center conductor to change a capacitance associated with the balun. Distances between the center conductors and the numbers and types of cage vias may also be varied, among other parameters.

In some implementations, the stepped balun is relatively compact and vertically (orthogonally) arranged through the printed wiring board. In some implementations, the stepped balun reduces or minimizes the footprint of a device (a unit cell) containing the stepped balun. This may be relevant for wideband, wide-scan angle phased array applications having a unit cell with an area $\leq(\lambda/2)^2$, where $\lambda$ is the wavelength of the phase array. In this regard, the stepped balun may have applicability for phased array applications and other applications where improved RF (radio frequency) performance and economical use of unit cell area, substrate thickness, and weight may be a consideration.

In some implementations, the four-step balun is configured to operate anywhere over a five-octave bandwidth (e.g., 0.150 GHz (gigahertz) to 4.8 GHz) at relatively low-loss performance. In an example implementation, in a stepped balun having a 50Ω GPO (standard coaxial) connector input impedance and a two-conductor output impedance varying from 40Ω to 75Ω, the maximum signal loss is 0.290 dB (decibels) at 4.8 GHz for a two-conductor impedance of 75Ω. In an example implementation, a stepped balun has a 75Ω coaxial input and 75Ω two-conductor output. In this implementation, the return loss and insertion loss over a five-octave bandwidth is comparable to the 50Ω input and 50Ω two-conductor impedance return loss and insertion loss. The maximum insertion is 0.11 dB at 4.6 GHz in this example. In an example, a stepped balun having a 50Ω coaxial input and 50Ω two-conductor output is scalable in frequency to operate at up to 30 GHz. The return loss and insertion loss are relatively low over a five-octave bandwidth of 1.2 GHz to 38.4 GHz. The maximum insertion loss is 0.19 dB at 38.4 GHz in this example.

The stepped balun operates in a TEM (transverse electromagnetic) transmission mode. In this regard, the stepped balun can be considered to operate as a non-resonant transmission line, or portion thereof, operating in the TEM mode. Resonant-mode losses, due to higher order modes like the TE11 mode, are far above the four-step balun configuration described herein. Using the TE11 mode cut-off frequency of a coaxial transmission line as a proxy for the TE11 mode cut-off frequency of the stepped balun, the following TE11 mode cut-off frequencies may be determined for the four-step balun configuration and the four-step mm-wave (millimeter wave) frequency configuration described below:

four-step operating band: 150 MHz-4.8 GHz
    TE11 mode cut-off frequency>13 GHz;
four-step mm-Wave frequency operating band: 1.2 GHz to 44.8 GHz
    TE11 mode cut-off frequency>75 GHz.

In some implementations, the rate of change of insertion phase versus frequency, which is called the "group delay," is a consideration in radar applications that transmit complex, wideband waveforms and also in commercial wireless communications such as 5G (fifth-generation of mobile telecommunications technology) wireless applications that use complex modulation schemes. As previously explained, the stepped balun operates in the TEM mode which, in some examples, may result in a group delay that changes in less than or equal to two picoseconds (ps) over a five-octave bandwidth, making the stepped balun appropriate for these types applications.

The stepped balun may be implemented using standard printed wiring board materials and fabrication techniques. This may facilitate use of the stepped balun with phased array antennas, as described below, in which hundreds or thousands of unit cells are fabricated across a number of printed wiring boards. The stepped balun may be fabricated as follows. An image and copper etch operation may be performed for each dielectric layer of a printed wiring board. A lamination cycle may be performed for a resulting stack of the dielectric layers in the printed wiring board. A drill and copper plate operation may be performed or the resulting stack. Finally, the stack may be back-drilled to produce the cage vias.

In an example configuration of the stepped balun, the primary cage vias are on a 0.140 inches (3.6 millimeter (mm)) diameter circle or arc (that is, less than a full circle) around the center conductor. The secondary cage vias are on a 0.236 inches (6.0 mm) diameter circle around the center conductor. In this example, the total height of the stepped balun is 0.143 inches (3.5 mm) and the height-to via diameter aspect ratio is six. These, however, are examples of dimensions. Stepped baluns may have different dimensions than these.

Figure 12:
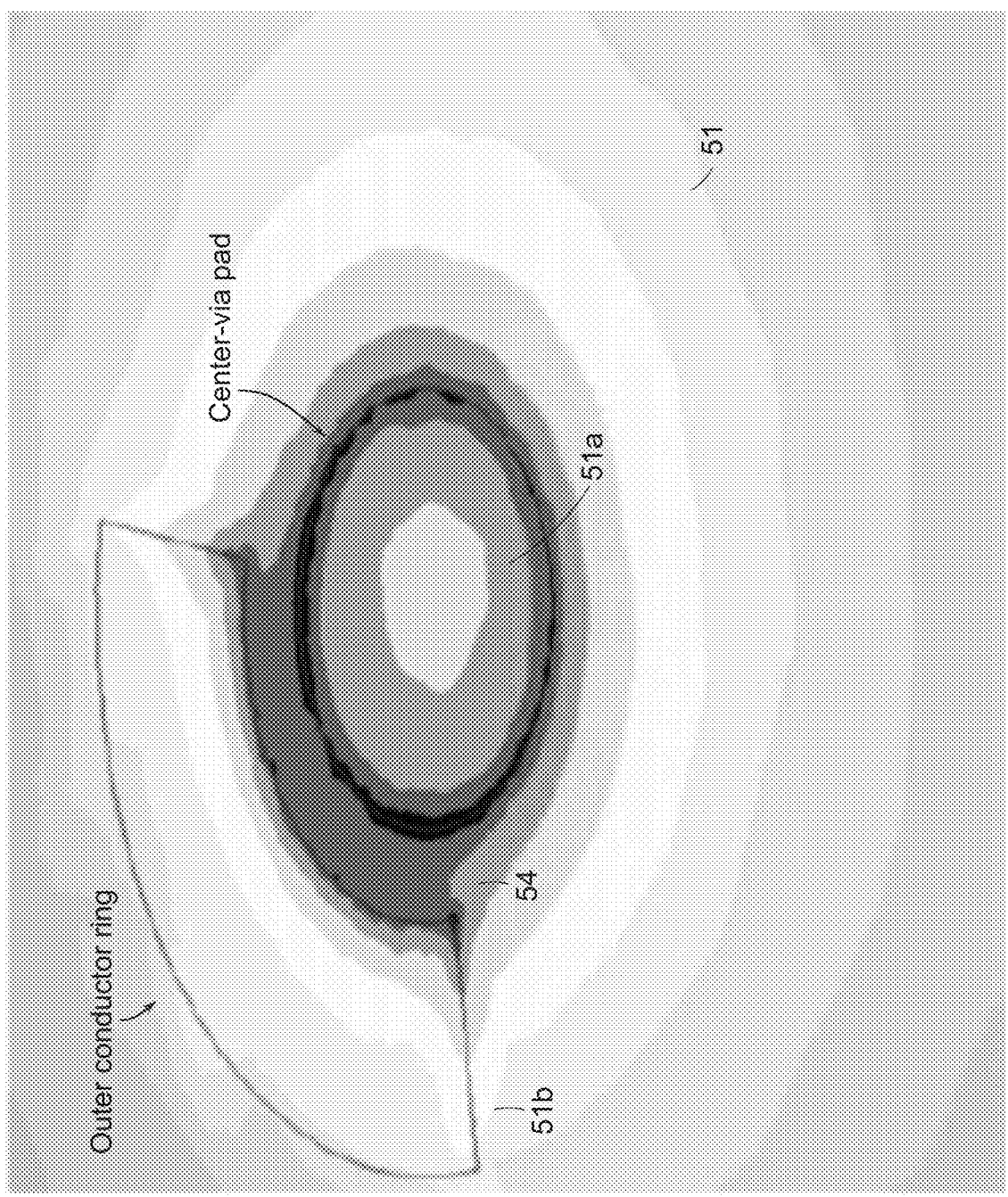
FIG. 12 is a plot showing variations in electric field magnitude concentrations in the example stepped balun of FIG. 11.

FIG. 11 shows a side view of a components of a stepped balun 48 (including dielectric layers 50) having the dimensions described in the preceding paragraph, along with a cut plane 49 at the two-conductor balanced port side of the stepped balun. Electric field magnitude is evaluated for a 2.4 GHz signal through the balun at the cut plane. FIG. 12 shows variations in electric field magnitude concentrations 51, 54 at the two-conductor ports 51a, 51b (center-via pad and outer conductor ring, respectively) at the cut plane. In this example, the power outside the stepped balun region is less than −50 dB relative the peak power between the two conductors at the balun's balanced connection. Secondary cage vias are not included in this example. As shown in FIG. 12, greater electric field magnitudes are concentrated between the center-via pad and outer conductor ring.

Figure 13B:
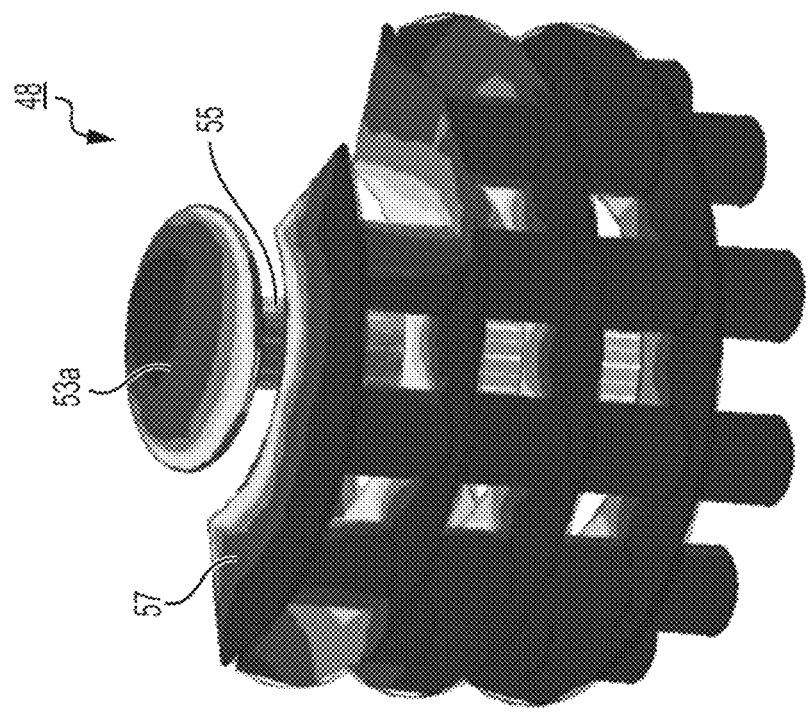
FIGS. 13A and 13B are perspective view of the example balun of FIG. 11 showing surface current density concentrations.
Figure 13A:
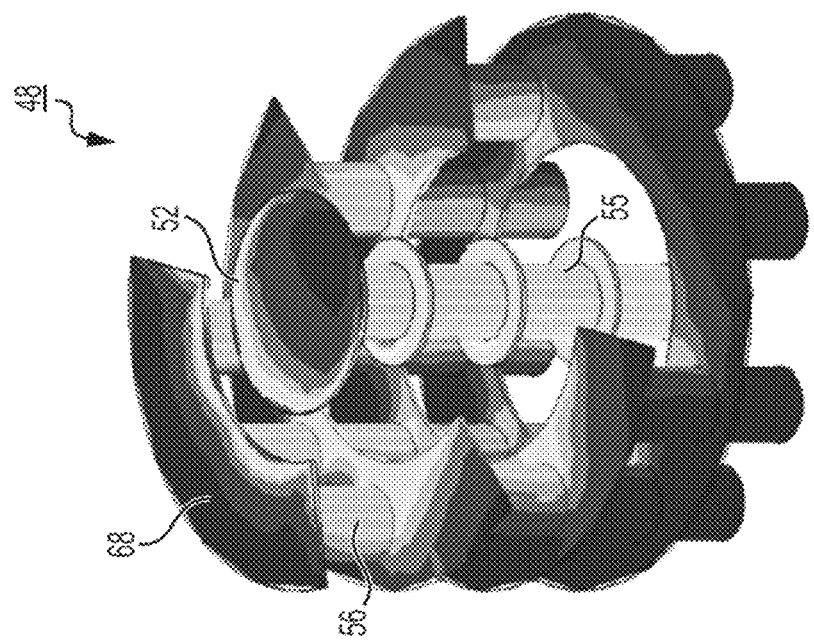
Figure 14B:
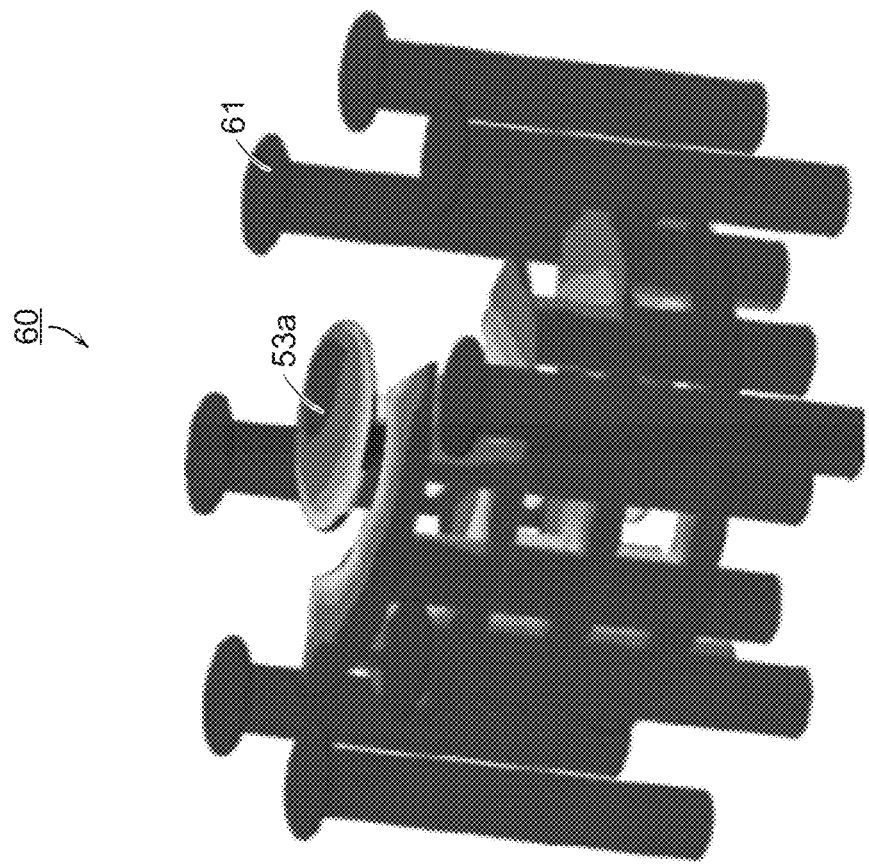
FIGS. 14A and 14B are perspective views of an example stepped balun having secondary cage vias showing surface current density concentrations.
Figure 14A:
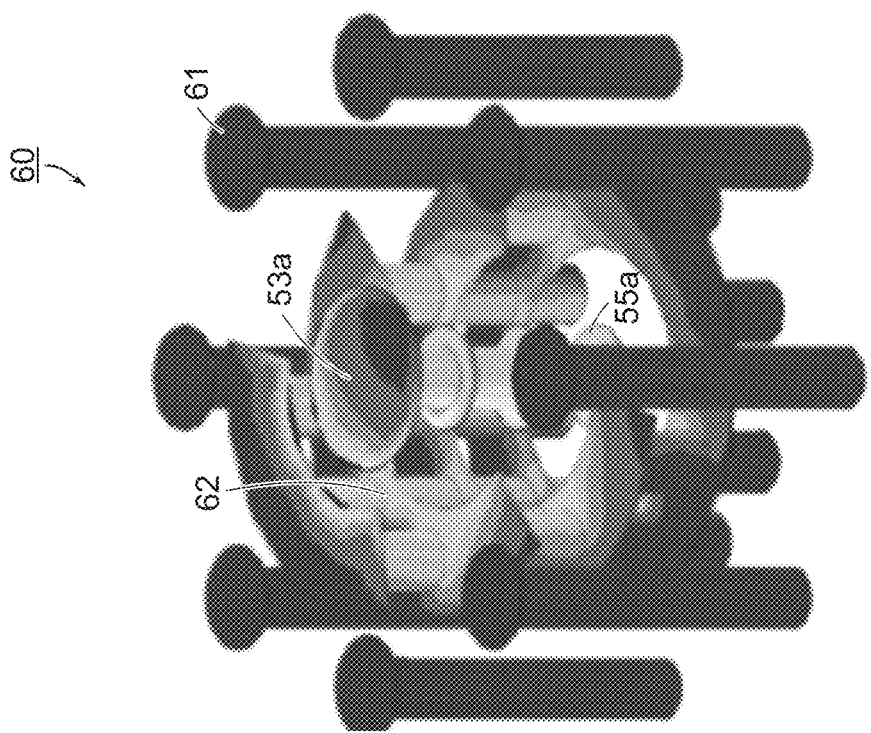

FIGS. 13A and 13B show, for stepped balun 48, a surface current density magnitude 52 (FIG. 13) between the center conductor 55, three of the cage vias 56, and top outer conductor ring 57. Secondary cage vias are not included in the example of FIGS. 13A and 13B. FIGS. 14A and 14B show a surface current density magnitude for a stepped balun 60 having the configuration of FIG. 1 and also having secondary cage vias 41 as in balun 40 of FIG. 9. As is evident by the dark shading, secondary cage vias 41, grounded to the primary cage vias, have negligible surface current density. Electromagnetic energy 62 (FIG. 14A) is concentrated between the center conductor 55a (FIG. 14A) and center-via pad 53a, (FIGS. 13B, 14A and 14B), and top outer conductor pad connected to the three primary cage vias (vias 56 in FIG. 13A).

Figure 15:
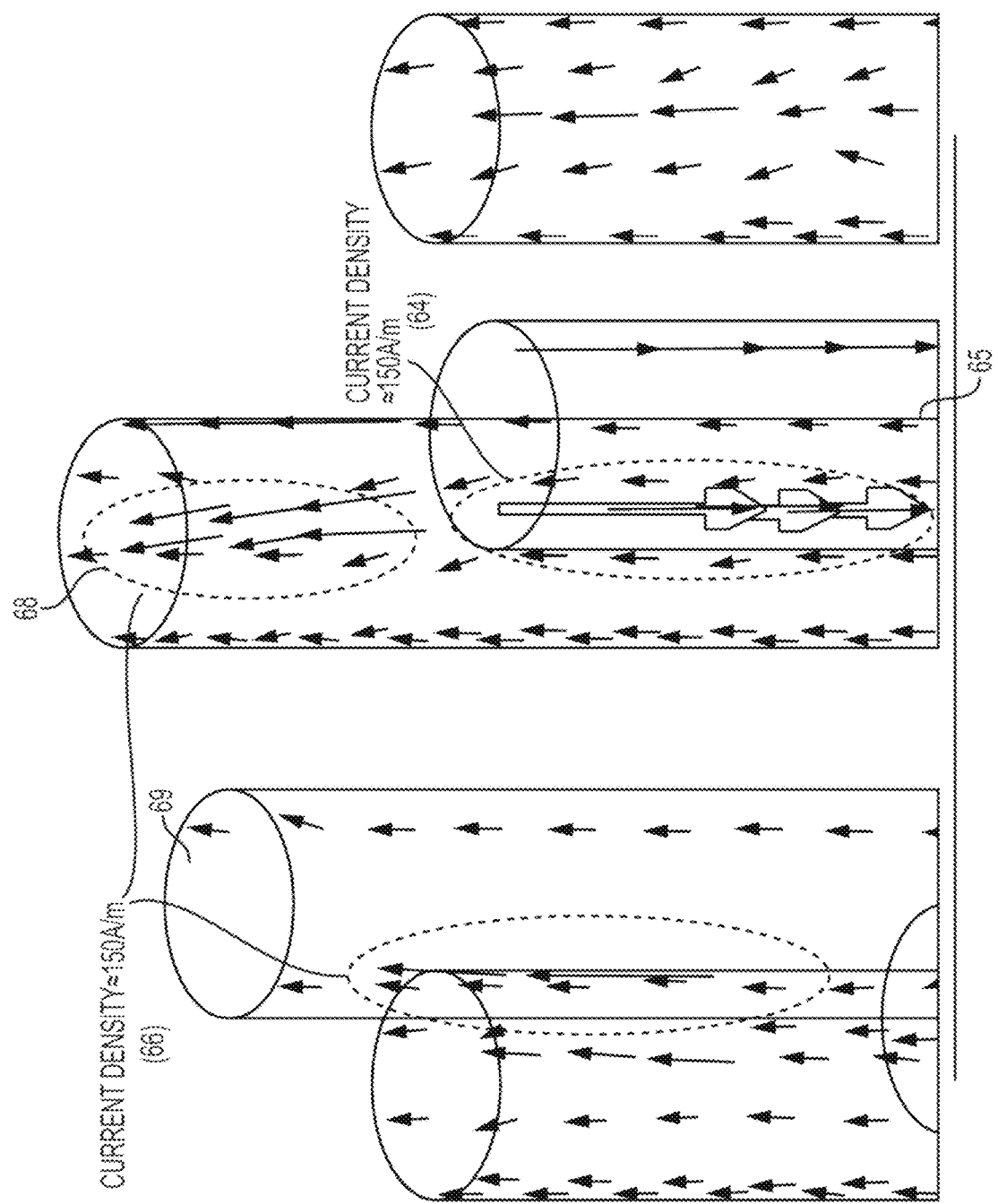
FIG. 15 is a perspective view of a center conductor and cage vias of an example stepped balun showing current magnitude and direction using arrows.

FIG. 15 show the surface current density directions for primary cage vias in an example stepped balun. The largest current vector 64 on the center conductor 65 faces the two outer conductor vias 68, 69, and points downward. The largest current vectors 66 on two outer conductor cage vias point upward. The current densities are equal, and opposite in direction in this example. The maximum magnitude of the current density is on the center conductor and is about 150 A/m (amperes-per-meter). The two facing cage vias 68, 68 each have a surface current of about 75 A/m. Secondary cage vias are not included FIG. 15.

Figure 16:
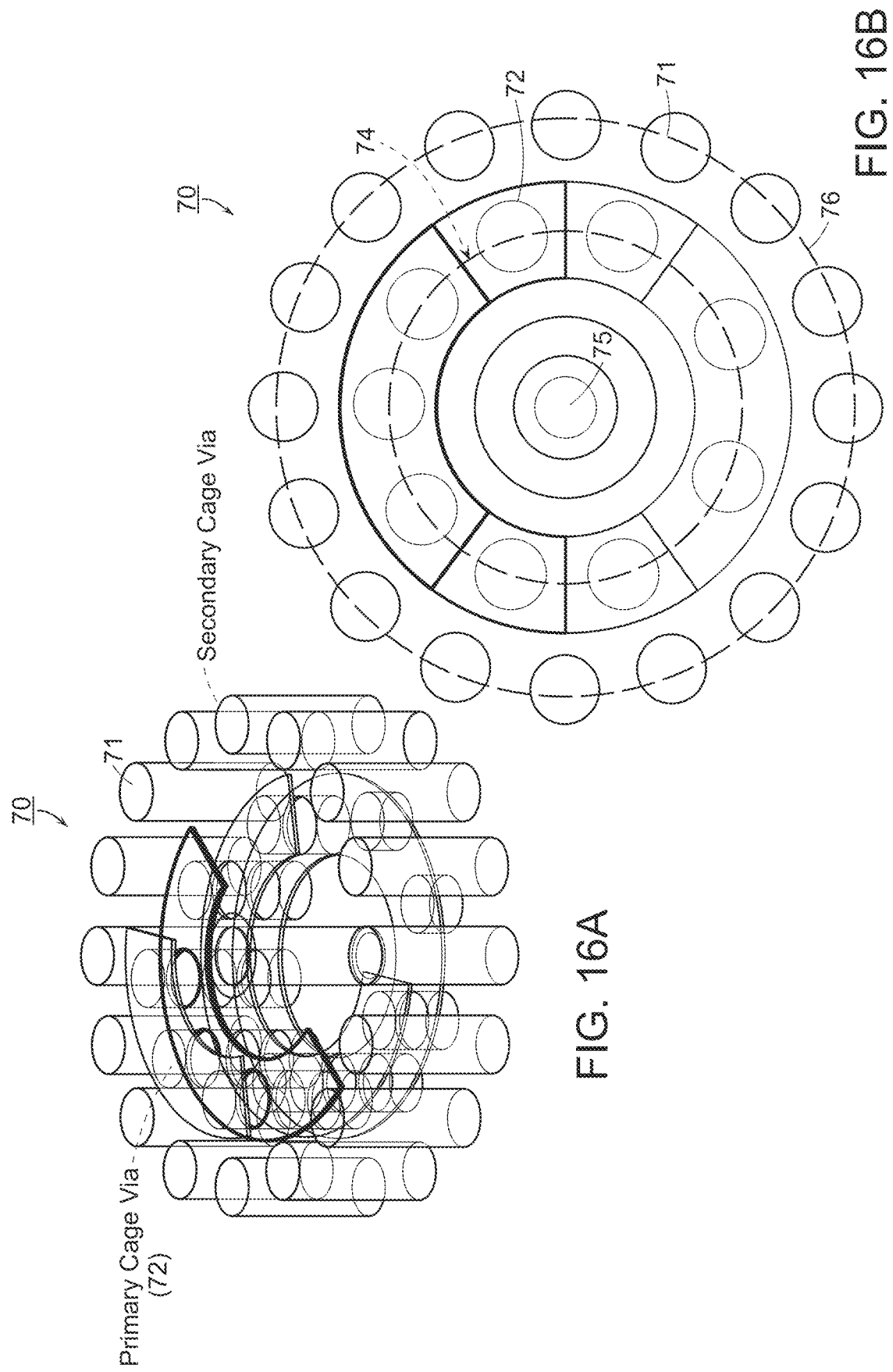
FIG. 16A is transparent perspective view of an example stepped balun configured for millimeter-wave applications.
FIG. 16B is top view of the example stepped balun of FIG. 16A.
Figure 17:
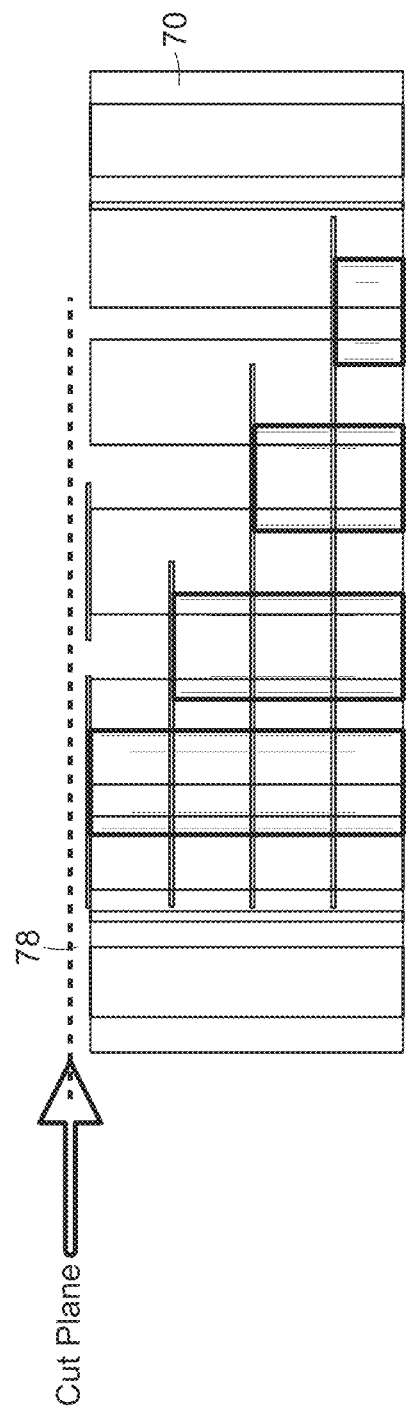
FIG. 17 is a side view of the example stepped balun of FIG. 16A.

FIGS. 16A and 16B show views of an example four-step balun 70 configured for operation at mm-wave (millimeter-wave) frequencies. Stepped balun 70 has a 50Ω on coaxial input. Stepped balun 70, like stepped balun 10 of FIG. 1, includes four steps having physical and electrical connections to nine cage vias, seven cage vias, five cage vias, and three cage vias, respectively, as shown in FIG. 17. However, stepped balun 70 includes sixteen secondary cage vias 71 surrounding the primary cage vias 72. In this example, primary cage vias 72 are on a 0.024 inch (6 mm) diameter circle 74 relative to center conductor 75. Secondary cage vias 71, which are electrically connected to the same electrical ground as the primary cage vias, are on a 0.038 inch (9.6 mm) diameter circle 76 relative to center conductor 75, as shown in FIG. 16B. All vias are 0.0048 inches (0.12 mm) in diameter. The vias may be fabricated using a standard microvia processes. The microvia aspect ratio is 0.75:1 tier each via in this example.

Figure 18:
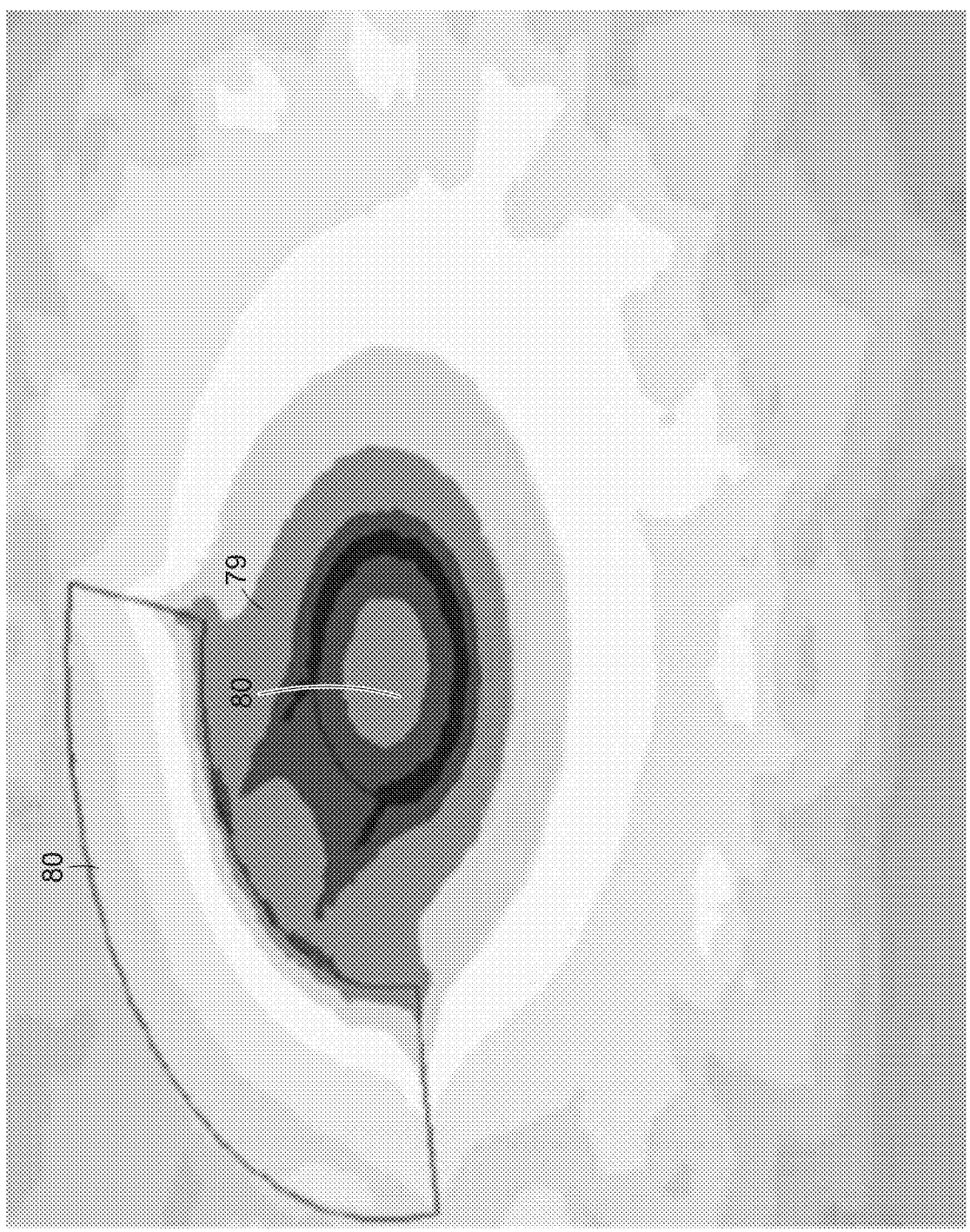
FIG. 18 is a plot showing variations in electric field magnitude concentrations in the example stepped balun of FIG. 16A.

FIG. 17 shows stepped balun 70 having the dimensions described in the preceding paragraph along with a cut plane 78 at the two-conductor balanced port side of the stepped balun, where the electric field magnitude is evaluated for a 19.2 GHz signal. FIG. 18 shows the electric field magnitude concentrations 79, at the two-conductor port 80 of stepped balun 70. The power outside the balun region is less than −55 dB relative the peak power between the two conductors.

Figure 19:
FIG. 19 is a perspective view of the example balun of FIG. 16A showing surface current density concentrations.

FIG. 19 shows, for stepped balun 70, a surface current density magnitude between center via 81 and primary cage vias 72. The currents, and the electric field (shown in FIG. 18), are focused between center via 81 and inside of primary cage vias 72a. There is a small current density on secondary cage vias 71.

Figure 20:
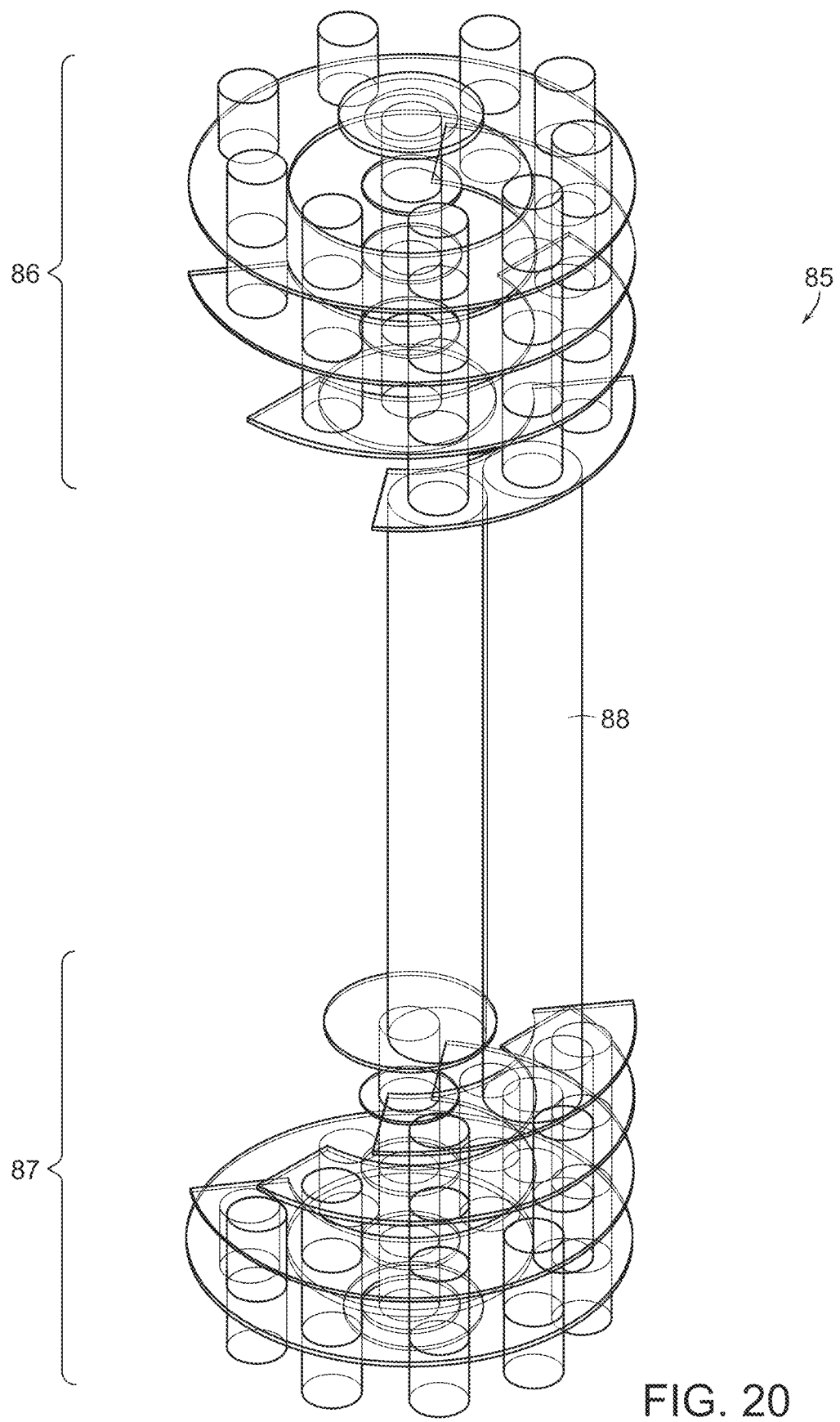
FIG. 20 is a transparent perspective of an example system connecting two stepped baluns together on a transmission line.
Figure 21:
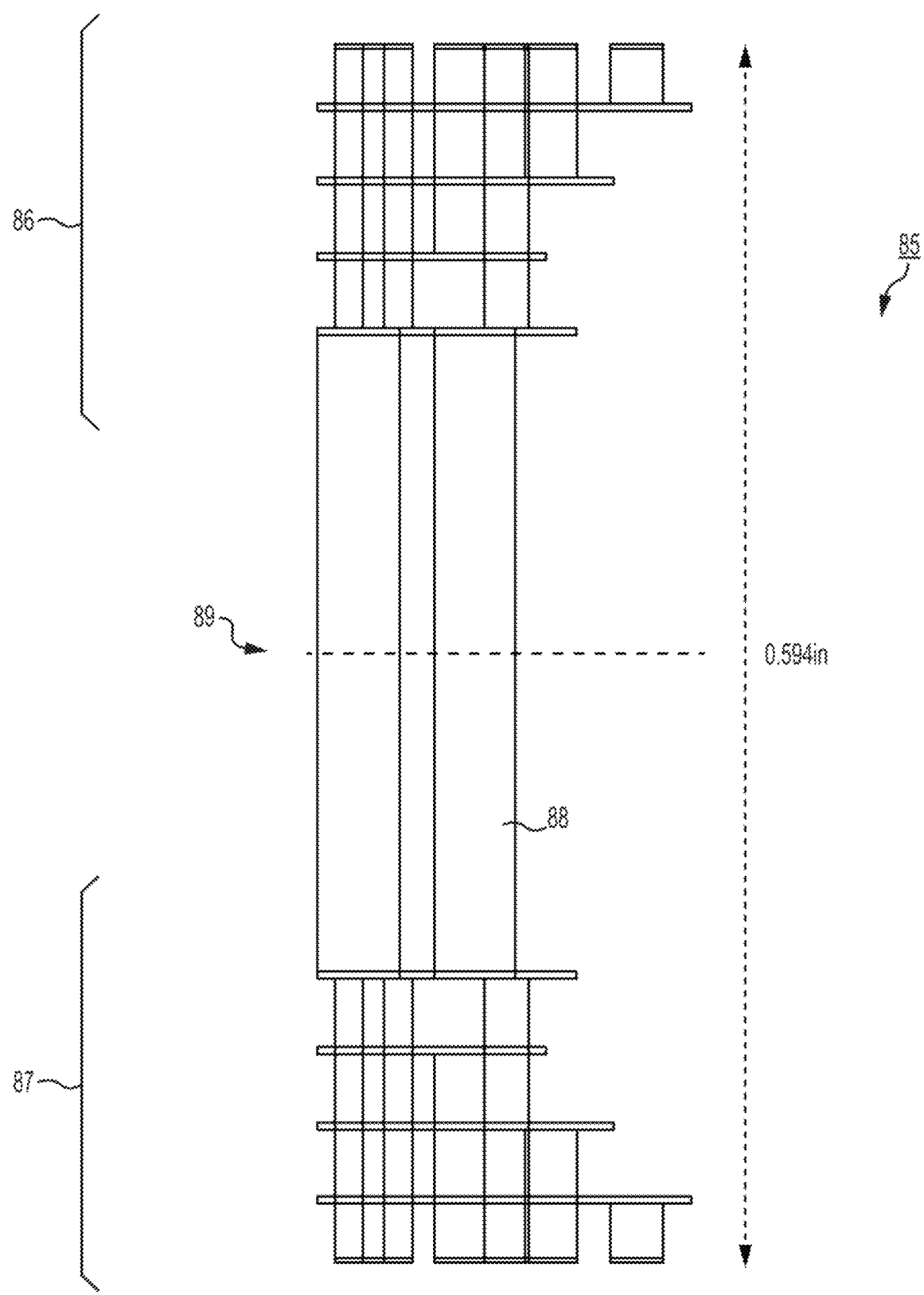
FIG. 21 is a side view of the example system of FIG. 20.

FIG. 20 shows an example system 85 having a first stepped balun 86, a second stepped balun 87, and a transmission line 88 between the first stepped balun and the second stepped balun. Transmission line 88 is a two-conductor balanced transmission line. The first and second stepped baluns are connected to the transmission line through respective balanced connections thereof. Coaxial cables may be connected to the unbalanced connections of stepped baluns 86 and 87. In the implementation of FIG. 20, stepped baluns 86 and 87 do not include secondary cage vias. However, secondary cage vias may he used with either or both stepped baluns. FIG. 21 shows system 85 with a length of 0.594 inches and having a cut plane 89 along transmission line 88, where electric field magnitude is evaluated for a 19.2 GHz signal.

Figure 22:
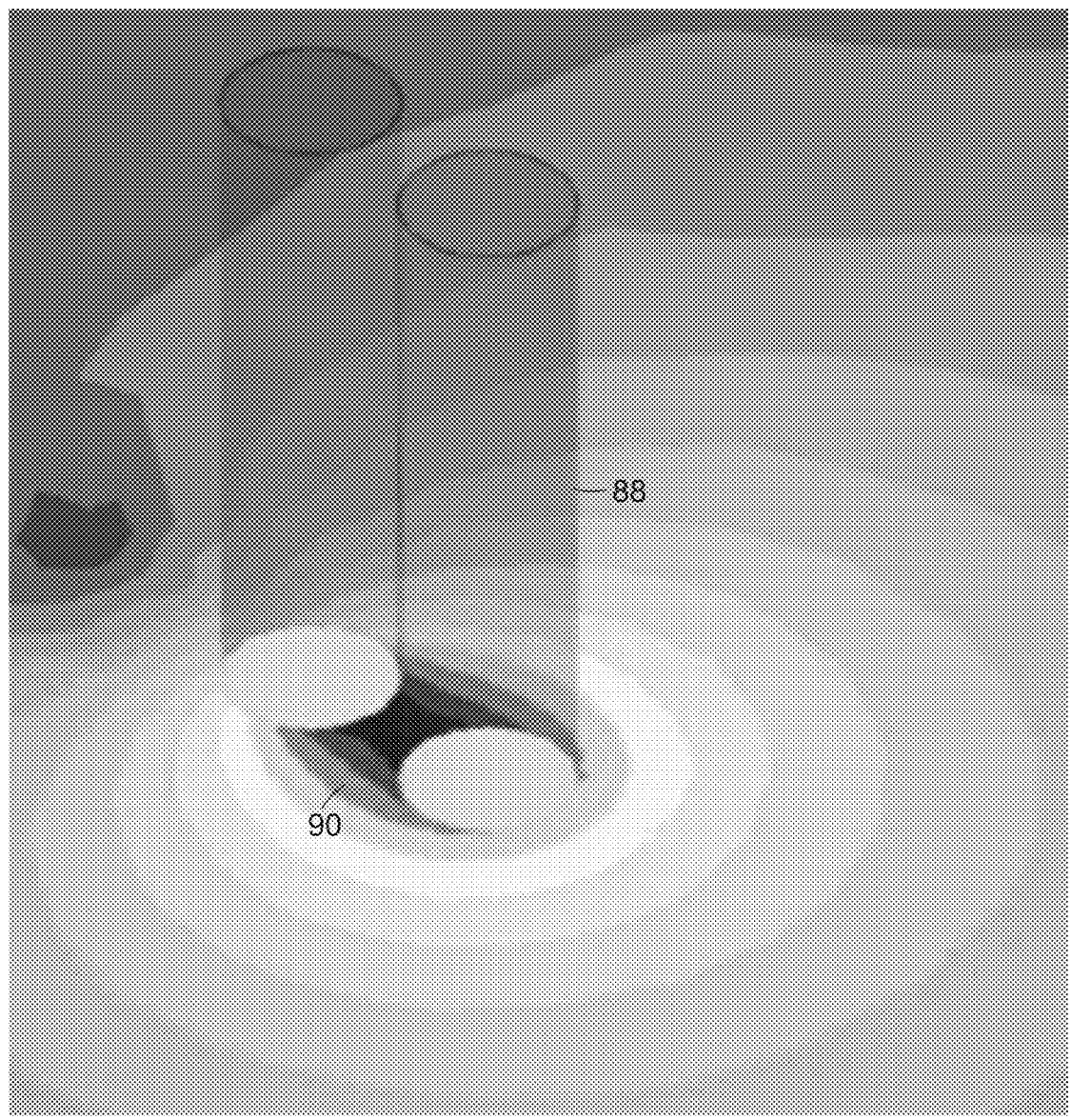
FIG. 22 is a plot showing variations in electric field magnitude concentrations in the example stepped balun system of FIG. 20.
Figure 23A:
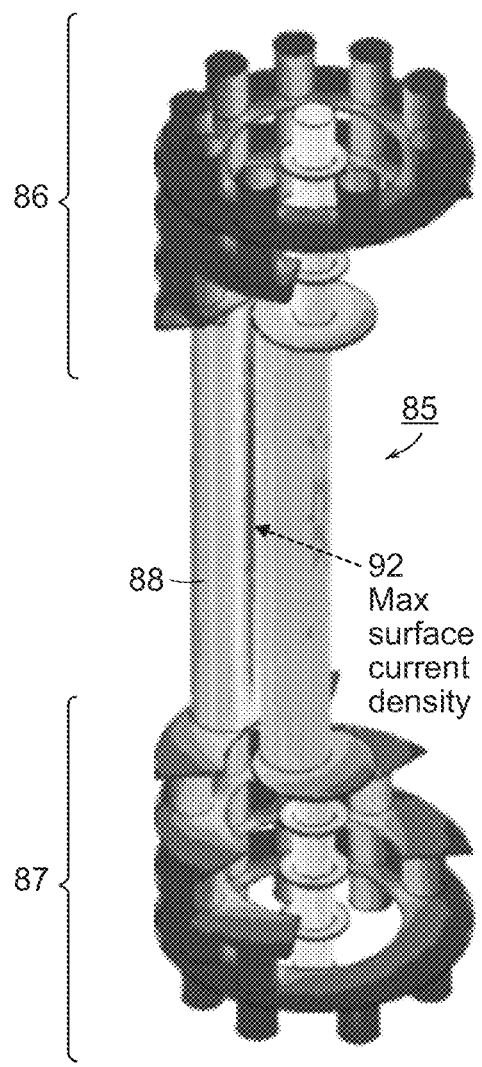
FIGS. 23A and 23B are perspective views of the example system of FIG. 20 showing surface current density concentrations.
Figure 23B:
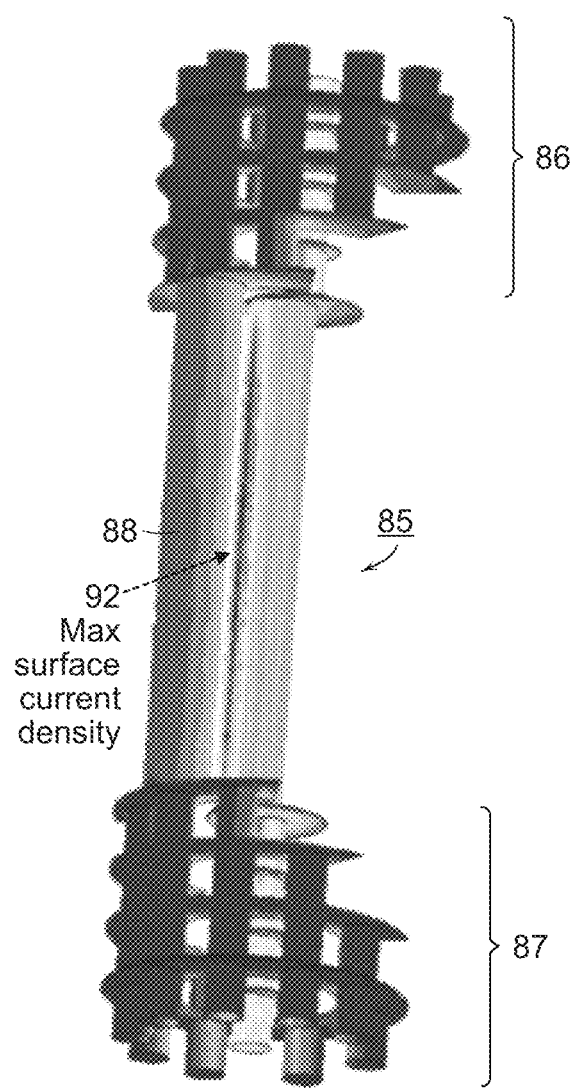
Figure 24:
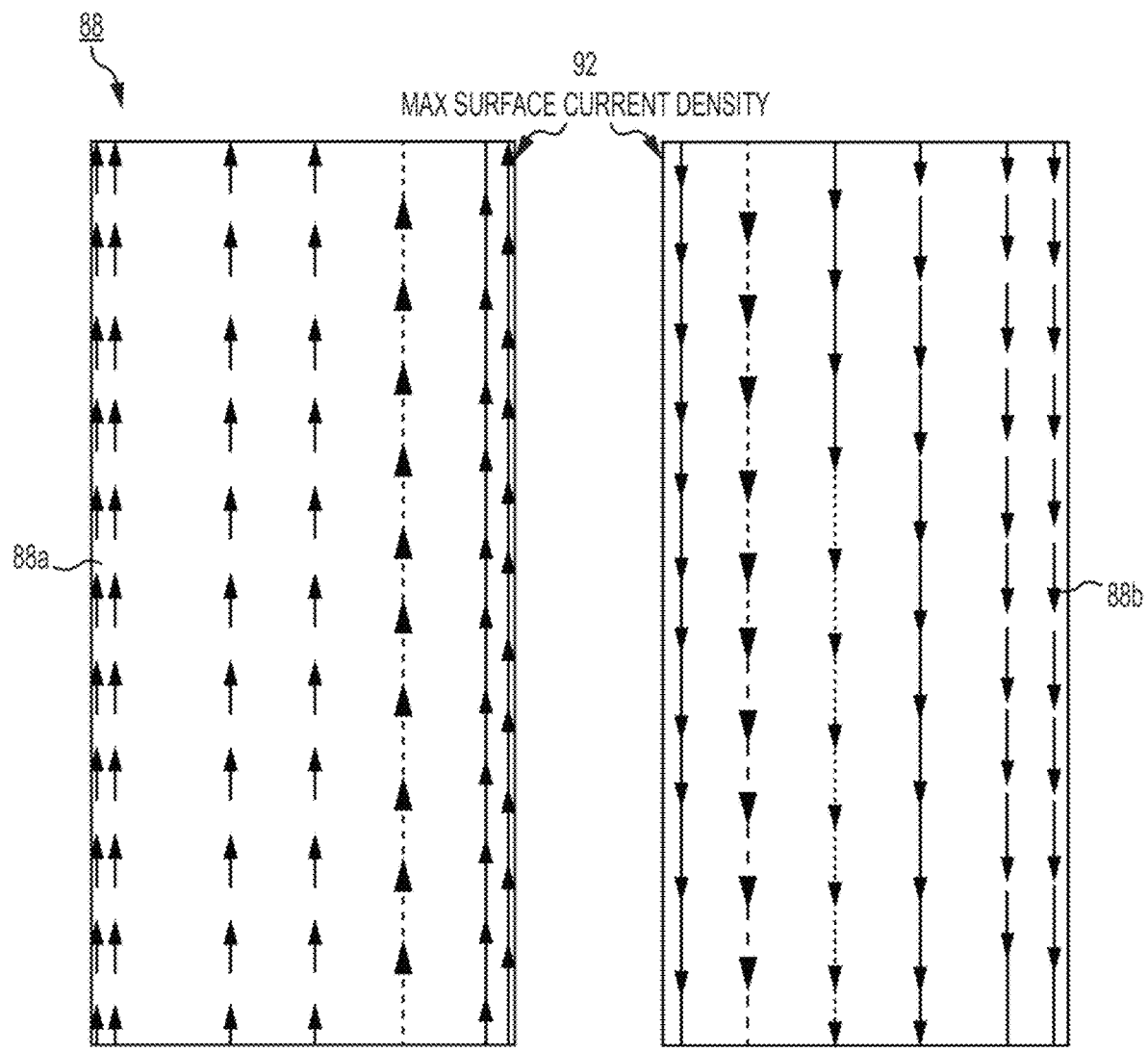
FIG. 24 is a side view of conductors in a two-conductor transmission line used in the example system of FIG. 20 showing magnitude and direction on the conductors using arrows.

FIG. 22 shows the electric field magnitude concentrations 90 at the cut plane. FIGS. 23A and 23B show the surface current density magnitude of system 85. The maximum current densities 92 on the two-conductor transmission line 88 are on the transmission line—that is, the conductor—surfaces facing each other. FIG. 24 shows the vector surface current density magnitude between conductors 88a and 88b in two-conductor transmission line 88. The maximum current densities on the two-conductor transmission line are on the surfaces of conductors 88a and 88b that face each other. The currents are equal and 180° out of phase.

The stepped balun may be configured for use with standard radiators (e.g., antennas) such as the dipole radiator. The stepped balun also may be configured for use with phased array antenna configurations, as described herein. The stepped balun may be configured for use with narrow-band (≤20% tunable bandwidth), to wide-band (>20% tunable bandwidth), to multi-octave tunable bandwidth two-terminal balanced feed antennas, such as a dipole antenna, a bow-tie antenna, a sinuous antenna, a spiral antenna, and the like.

Antennas such as those identified above may be used in a variety of systems including, but not limited to, a phased array radar, communication antennas and arrays, remote sensing arrays, and medical imaging antennas and arrays (e.g., microwave based tumor imaging). The stepped balun may be used for low-profile, low-loss, wide scan-angle, multi-band performance applications. Example applications of this type may include sensors on aircraft, helicopters, drones, and the like. In these applications, the stepped balun, which may be lightweight, low profile, and perform multiple tasks, may be configured for use over multiple frequency bands. Such frequency bands may include, but are not limited to, frequency bands for weather radar, collision avoidance, ground terrain mapping, and/or electronic warfare. The stepped balun may be configured for use with ground and ship based radar systems, for example, for dual-band radars that take advantage of low frequency search (e.g., UHF (ultra-high frequency) band (300 MHz to 3 GHz)) and higher frequency resolution track (e.g., C-Band (4 GHz to 8 GHz)).

Figure 25:
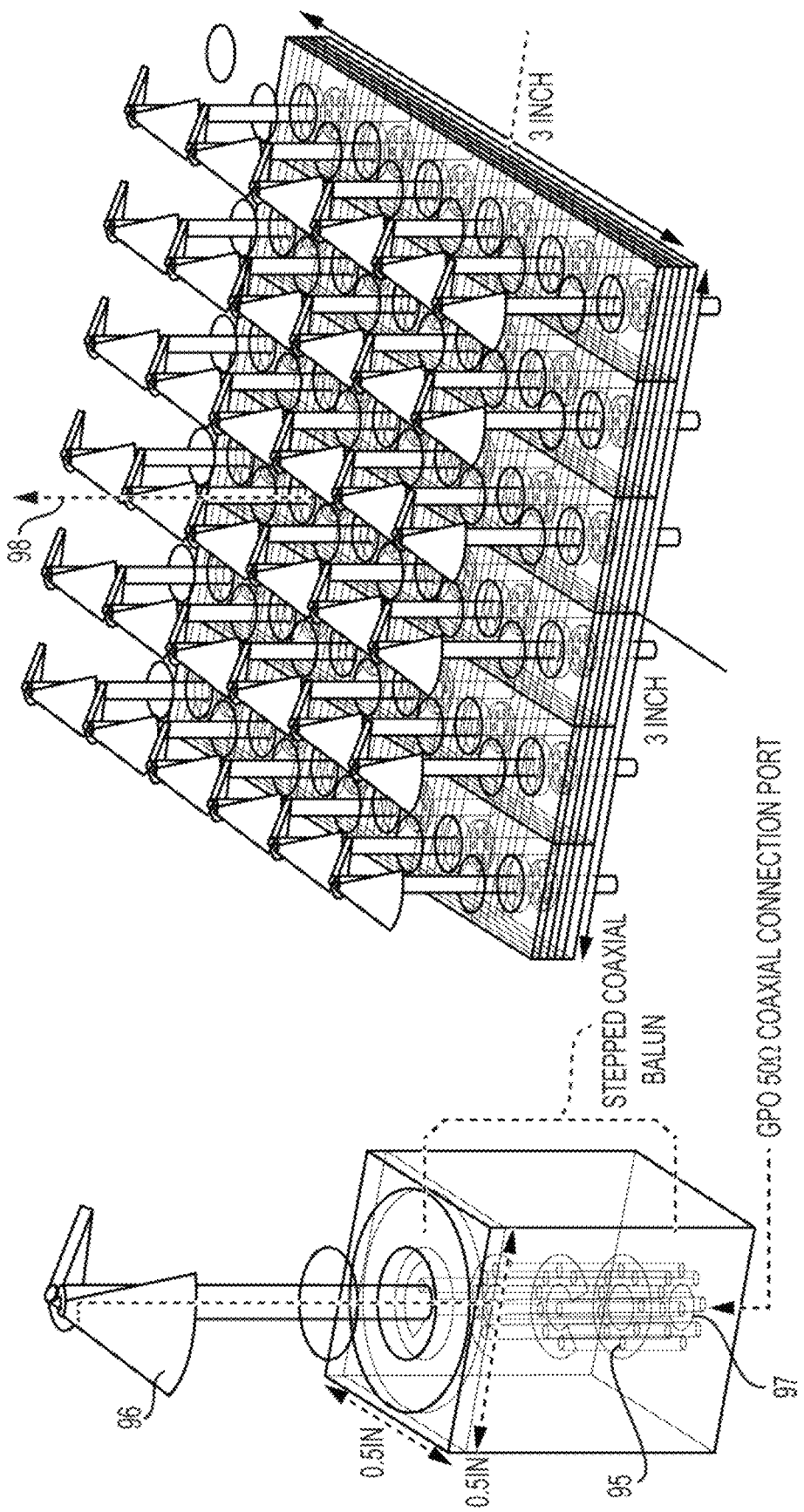
FIG. 25 shows a stepped balun configured to feed an electrically small, S-Band array radiator and a phased array of such radiators.

An electrically or physically small antenna may require an electrically or physically small coaxial balun. FIG. 25 shows a stepped coaxial balun 95 configured to feed an electrically small (i.e. 3 inch×3 inch), S-Band array radiator 96 having a 60 Ω ohm input impedance. The coaxial port 97 of stepped coaxial balun 95 includes a 50 Ω GPO connector. In this example, the total combined signal loss is less than or equal to 0.2 dB from 2.2 GHz to 2.6 GHz using a 0.5 inch (12.7 mm)×0.5 inch (12.7 mm) unit cell (a λ/10×λ/10 unit cell). S-Band array radiator 96 and the stepped balun are part of phased array 98 containing multiple S-Band array radiators and stepped baluns of the same type. In a phased array each antenna includes an analog transmitter/receiver module configured to create phase shifting required to electronically steer an antenna beam.

Figure 26:
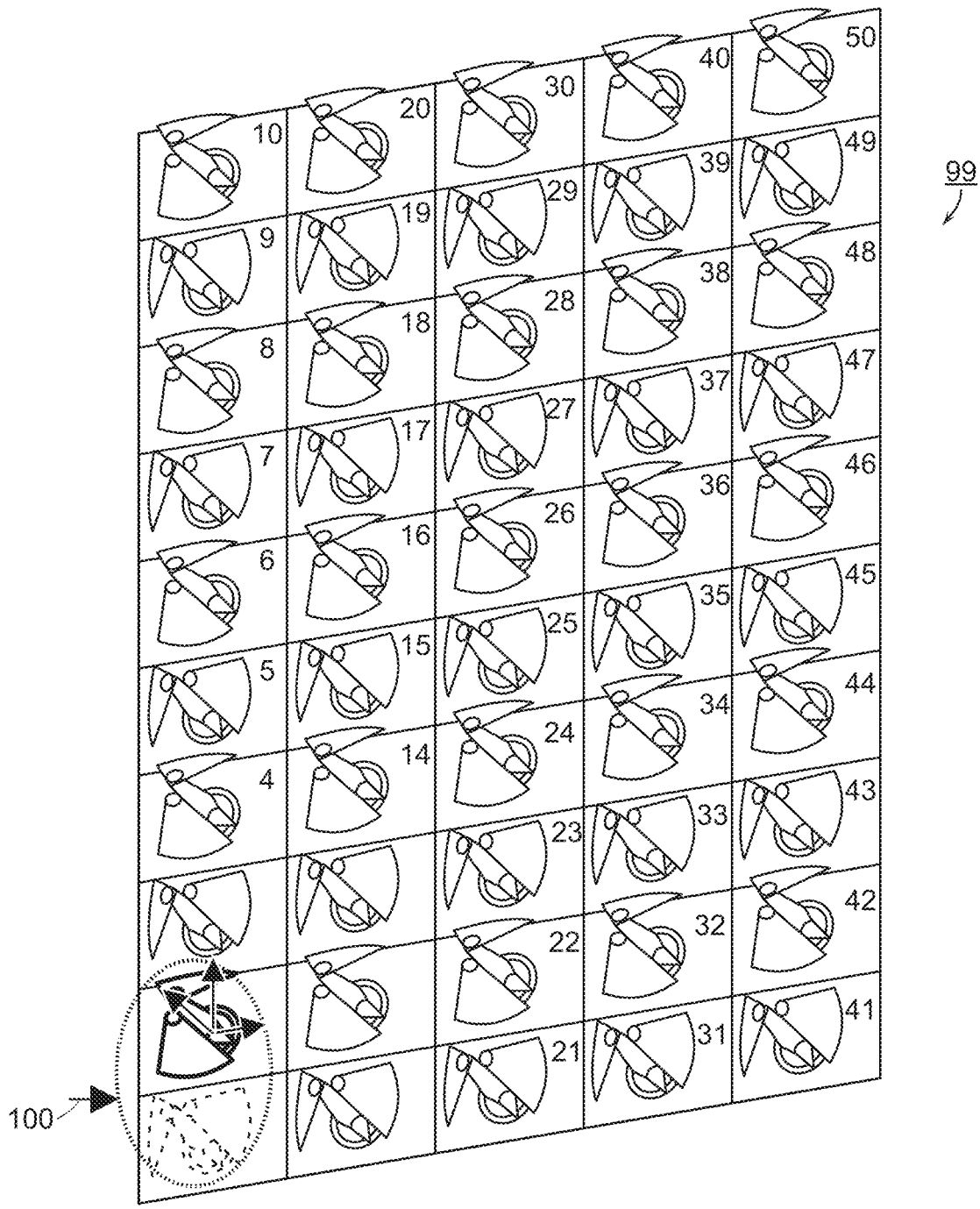
FIG. 26 is a perspective view of an example dual-linear polarized X-Band array containing stepped baluns.

The stepped balun may be configured for use with bow-tie radiators. In this regard, FIG. 26 shows an example dual-linear polarized X-Band array 99. In each cell (1-50) of array 99, there is a vertical and horizontal bow-tie radiator 100. Both linear polarized radiators may be fed by a stepped balun.

Figure 27A:
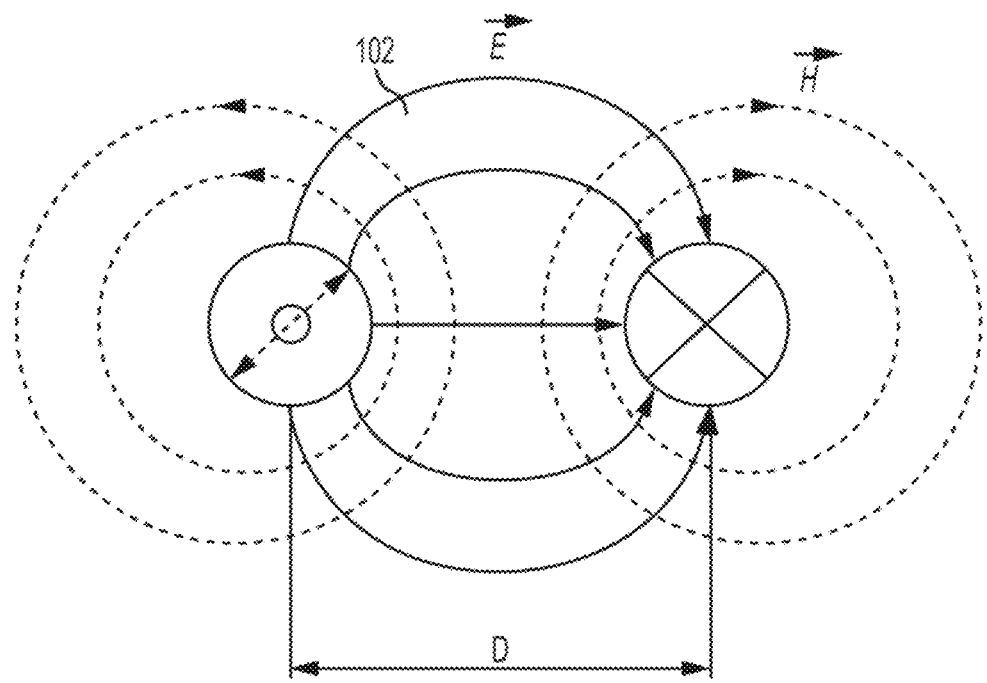
FIGS. 27A and 27B are diagrams of two conductors in a balanced transmission line, along with electric and magnetic field lines for those two conductors.
Figure 27B:
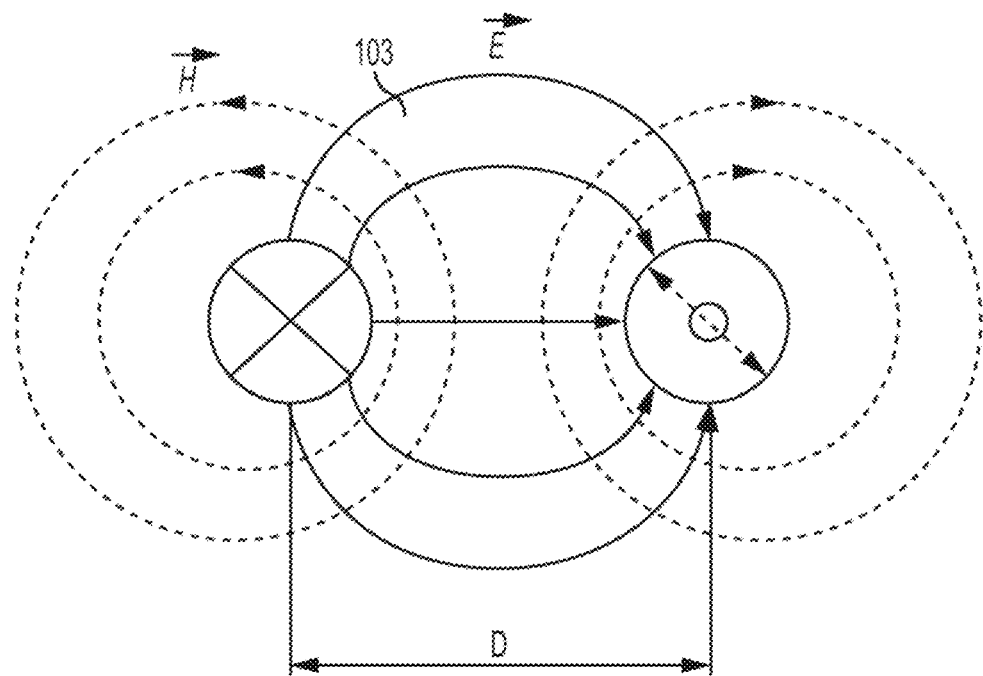

The stepped balun may he configured for use with a dual-linear polarized radiator. An example polarized radiator having a common phase-center may require each pair of antenna terminals to be fed with orthogonal electric fields. The stepped balun may be configured to rotate the electric field E (and magnetic field H) thereof by rotating the outer conductor thereof through any angle relative to the center conductor. The center conductor and the outer conductor are separated by a distance D. For example, in a stepped balun, the cage vias of the stepped balun may rotated relative to center conductor. As a result, the electric fields E (and magnetic field H) may rotate from fields 102 in FIG. 27A to fields 103 in FIG. 27B.

As noted previously, the stepped balun may be configured for use with 5G cellular applications. In this regard, example 5G handsets include up to 10 antennas. More antennas means less antenna area; therefore, it may be advantageous to reduce antenna size while maintaining antenna efficiency. The stepped balun may be configured to provide an efficient, electrically and physically small antenna and balun for 5G cellular telephone handsets. In this regard, the five-octave band performance of some implementations of the stepped balun covers the following 5G frequency bands i. "Low-band 5G". 600-850 MHz, 50-250 Mbps; 4-Step design covers this frequency band;
 ii. "Mid-band 5G". 2.5-3.7 GHz, 100-900 Mbps; 4-Step mm-Wave Frequency design covers this frequency band;
 iii. "High-band 5G". 25-39 GHz, 1.8 Gbps; 4-Step mm-Wave Frequency design covers this frequency band.

Furthermore, antenna arrays deployed on cellular phone towers may require low-loss front-ends to reduce power amplifier prime power and air-cooling requirements, which are key cost drivers for 5G performance. The stepped balun, which is relatively low loss and operable over a wide band, may be configured for use in a MIMO (Massive Input/Massive Output) 5G system. The stepped balun may reduce prime power and possibly reduce the weight of the antenna/feed assembly.

The stepped balun may be configured to connect to a circuit board containing a digital signal processor (DSP). In this regard, components, such as differential amplifiers, used in DSP applications require differential signal inputs. The stepped balun may be configured for use on a DSP backplane assembly, where component area is extremely limited, to provide a low-loss, low dispersion, wideband balun signal transformation from an unbalanced transmission line (e.g., a coaxial connector) to the two-terminal input of the differential amplifier. In addition, higher data rates require faster pulse rise/fall times. The multi-gigahertz, low dispersion performance of the stepped balun may be configured to handle pulse rise times that are on the order of nanoseconds.

The stepped balun may be configured for use with medical applications, as noted. In this regard, there is a need for compact, lightweight RF antennas for medical applications such as tumor imaging, cancer therapy, and the like, where lower microwave frequencies (e.g., L- or S-Band) are required for penetration deep into the human body to image tumors. In an example, the 3 inch (76.2 mm)×3 inch S-Band Array of FIG. 25 may be part of medical diagnostics and/or therapy system.

Any "electrical connection" as used herein may include a direct physical connection or a wired or wireless connection that includes or does not include intervening components but that nevertheless allows electrical signals to flow between connected components. Any "connection" involving electrical circuitry that allows signals to flow, unless stated otherwise, is an electrical connection and not necessarily a direct physical connection regardless of whether the word "electrical" is used to modify "connection".

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A balun comprising:
a center conductor that passes through a printed wiring board comprised of multiple dielectric layers; and
cage vias arranged relative to the center conductor, the cage vias comprising:
a first set of cage vias that extend between an unbalanced connection to the balun and a balanced connection to the balun, the first set of cage vias being part of a first circular arc and being connected. to electrical ground through a first ground ring; and
a second set of cage vias that extend from the unbalanced connection part-way through the printed wiring board, the second set of cage vias being part of a second circular arc and being connected to the electrical ground through a second ground ring, the second circular arc being longer than the first circular arc.

2. The balun of claim 1, wherein the distance from the balanced connection to the unbalanced connection is first distance;
wherein the second set of cage vias extend a second distance through the printed wiring board; and
wherein the balun further comprises:
a third set of cage vias that extend from the unbalanced connection a third distance through the printed wiring board, the third distance being greater than the second distance and less than the first distance, the third set of cage vias being part of a third circular arc and being connected to the electrical ground through a third ground ring, the third circular are being longer than the first circular arc and shorter than the second circular arc.

3. The balun of claim 2, further comprising:
a fourth set of cage vias that extend from the unbalanced connection a fourth distance through the printed wiring board, the fourth distance being between the second distance and the third distance, the fourth set of cage vias being part of a fourth circular arc and being connected to the electrical ground through a fourth ground ring, the fourth circular arc being longer than the third circular arc and shorter than the second circular arc.

4. The balun of claim 3, wherein there are three vias in the first set of cage vias, five vias in the third set of cage vias, seven vias in the fourth set of cage vias, and nine vias in the second set of cage vias.

5. The balun of claim 1, wherein the second circular arc is 360° around the center conductor.

6. The balun of claim 1, wherein the cage vias are primary cage vias; and
wherein the balun further comprises secondary cage vias connected to the electrical ground, the secondary cage vias being arranged in a circular arc around the primary cage vias.

7. The balun of claim 6, wherein the secondary cage vias are arranged in a 360° circular arc around the primary cage vias.

8. The balun of claim 7, wherein the secondary cage vias extend from a layer of the printed wiring board at which the unbalanced connection is located to a layer of the printed wiring board at which the balanced connection is located.

9. The balun of claim I, further comprising:
one or more tuning rings connected along a length of the center conductor, the one or more tuning rings being configured to add capacitance to control how impedance of the balun changes with frequency for a signal passing through the balun.

10. The balun of claim 1, wherein the following parameters are selected to achieve target performance for the balun: diameters of the first set and the second set of cage vias and the center conductor, a number of layers of the printed wiring board with each layer corresponding to a termination point of the first set of cage vias and the second set of cage vias, a dielectric constant associated with dielectric material of the multiple dielectric layers, and tuning rings associated with the center conductor to change a capacitance associated with the balun.

11. The balun of claim 1, wherein the unbalanced connection is configured for connection to a coaxial cable:, and
wherein the balanced connection is configured for connection to an antenna.

12. The balun of claim 1, wherein the unbalanced connection is configured for connection to a coaxial cable; and
wherein the balanced connection is configured for connection to an antenna in a phased array comprising antennas, in which each antenna of the phased array comprises an analog transmitter/receiver module configured to create phase shifting required to electronically steer an antenna beam.

13. The balun of claim 1, wherein the unbalanced connection is configured for connection to a coaxial cable; and
wherein the balanced Connection is configured for connection 5G cellular telephone tower antenna.

14. The balun of claim 1, wherein the unbalanced connection is configured for connection to a coaxial cable; and
wherein the balanced connection is configured for connection to a circuit board containing a digital signal processor (DSP).

15. A balun comprising:
a center conductor that passes through a printed circuit wiring board comprised of multiple dielectric layers; and
stepped transitions between a balanced connection of the balun and an unbalanced connection of the balun, the stepped transitions comprising a plurality of ground rings arranged in circular arcs and connected to electrical ground, the plurality of ground rings increasing in length from a first ground ring of the plurality of ground rings at the balanced connection to a second ground ring of the plurality of ground rings at the unbalanced connection, the stepped transitions thither comprising cage vias connected between the second ground ring and each other ground ring of the plurality of ground rings.

16. The balun of claim 15, further comprising:
one or more tuning rings connected along a length of the center conductor, the one or more tuning rings being configured to add capacitance to control how impedance of the balun changes with frequency for a signal passing through the balun.

17. The balun of claim 15, wherein the unbalanced connection is configured for connection to a coaxial cable; and
wherein the balanced connection is configured for connection to an antenna in a phased array comprising antennas, in which each antenna of the phased array comprises an analog transmitter/receiver module configured to create phase shifting required to electronically steer an antenna beam.

18. The balun of claim 15, wherein the unbalanced connection is configured for connection to a coaxial cable; and wherein the balanced connection is configured for connection 5G cellular telephone tower antenna.

19. The balun of claim 15, wherein the unbalanced connection is configured for connection to a coaxial cable; and wherein the balanced connection is configured for connection to a circuit board containing a digital signal processor (DSP).

20. The balun of claim 15, wherein the cage vias are primary cage vias; and wherein the balun further comprises secondary cage vias connected to the electrical ground, the secondary cage vias being arranged in a 360° circular arc around the primary cage vias.

21. A system comprising:

a first balun and a second balun according to claim 15; and a transmission line between the first balun and the second balun, the first balun being connected to the transmission line through the balanced connection and the second balun being connected to the transmission line through the balanced connection.

* * * * *